United States Patent
Lee et al.

(10) Patent No.: US 11,569,145 B2
(45) Date of Patent: Jan. 31, 2023

(54) SEMICONDUCTOR PACKAGE WITH THERMAL INTERFACE MATERIAL FOR IMPROVING PACKAGE RELIABILITY

(71) Applicant: Samsung Electronics Co., Ltd., Suwon-si (KR)

(72) Inventors: Sanghyun Lee, Cheonan-si (KR); Juhyun Lyu, Cheonan-si (KR); Unbyoung Kang, Hwaseong-si (KR); Chulwoo Kim, Incheon (KR); Jongho Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 164 days.

(21) Appl. No.: 17/188,332

(22) Filed: Mar. 1, 2021

(65) Prior Publication Data

US 2021/0384096 A1    Dec. 9, 2021

(30) Foreign Application Priority Data

Jun. 3, 2020 (KR) .......................... 10-2020-0067167

(51) Int. Cl.
*H01L 23/36* (2006.01)
*H01L 23/40* (2006.01)
*H01L 25/065* (2006.01)

(52) U.S. Cl.
CPC .............. *H01L 23/36* (2013.01); *H01L 23/40* (2013.01); *H01L 25/0655* (2013.01)

(58) Field of Classification Search
CPC ....................................................... H01L 23/36

USPC ......................................................... 257/712
See application file for complete search history.

(56) References Cited

U.S. PATENT DOCUMENTS

| | | | |
|---|---|---|---|
| 10,510,707 B2 | 12/2019 | Tseng et al. | |
| 2010/0181665 A1* | 7/2010 | Casey | H01L 23/433 257/723 |
| 2018/0261528 A1 | 9/2018 | Chen et al. | |
| 2018/0294202 A1* | 10/2018 | Cheng | H01L 21/565 |
| 2018/0350755 A1 | 12/2018 | Huang et al. | |
| 2019/0148337 A1 | 5/2019 | Kim et al. | |
| 2019/0371699 A1 | 12/2019 | Yu et al. | |

FOREIGN PATENT DOCUMENTS

KR    101562706 B1    10/2015

* cited by examiner

*Primary Examiner* — Ajay Arora
(74) *Attorney, Agent, or Firm* — Muir Patent Law, PLLC

(57) ABSTRACT

A semiconductor package includes a first semiconductor chip mounted on the package substrate, a second semiconductor mounted on the package substrate and set apart from the first semiconductor chip in a horizontal direction thereby forming a gap between the first semiconductor chip and the second semiconductor chip. The semiconductor package further includes a first thermal interface material layer formed in the gap and having a first modulus of elasticity and a second thermal interface material layer formed on each of the first semiconductor chip and the second semiconductor chip and having a second modulus of elasticity, wherein the first modulus of elasticity is less than the second modulus of elasticity.

20 Claims, 14 Drawing Sheets

SEMICONDUCTOR PACKAGE WITH THERMAL INTERFACE MATERIAL FOR IMPROVING PACKAGE RELIABILITY

CROSS-REFERENCE TO RELATED APPLICATION

This application claims the benefit of Korean Patent Application No. 10-2020-0067167, filed on Jun. 3, 2020 in the Korean Intellectual Property Office, the disclosure of which is incorporated herein in its entirety by reference.

BACKGROUND

The inventive concept relates to a semiconductor package, and more particularly, to a semiconductor package for improving package reliability.

In accordance with a trend of multi-function, high-capacity, and miniaturization of electronic products, an integrated semiconductor package in which two or more semiconductor chips (semiconductor devices) are integrated, for example, a system in package (SIP), has been proposed. In an integrated semiconductor package, warpage may occur during a manufacturing process or use because each component has various coefficients of thermal expansion (CTE). Accordingly, in the integrated semiconductor package, package components may be delaminated from each other due to the warpage or cracks, and thus, package reliability may be reduced.

SUMMARY

The inventive concept provides a semiconductor package for improving package reliability.

According to an aspect of the inventive concept, there is provided a semiconductor package including a package substrate; a first semiconductor chip mounted on the package substrate; a second semiconductor mounted on the package substrate and set apart from the first semiconductor chip in a horizontal direction thereby forming a gap between the first semiconductor chip and the second semiconductor chip; a first thermal interface material layer formed in the gap and having a first modulus of elasticity; and a second thermal interface material layer formed on each of the first semiconductor chip and the second semiconductor chip and having a second modulus of elasticity, wherein the first modulus of elasticity is less than the second modulus of elasticity.

According to another aspect of the inventive concept, there is provided a semiconductor package including: a package substrate; an interposer substrate mounted on the package substrate; a first semiconductor chip mounted on the interposer substrate; a second semiconductor chip mounted on the interposer substrate and set apart from the first semiconductor chip in a horizontal direction thereby forming a gap between the first semiconductor chip and the second semiconductor chip; a first thermal interface material layer formed in the gap and having a first modulus of elasticity; and a second thermal interface material layer formed on each of the first semiconductor chip and the second semiconductor chip and having a second modulus of elasticity, wherein the first modulus of elasticity is less than the second modulus of elasticity.

According to another aspect of the inventive concept, there is provided a semiconductor package including: a package substrate comprising a first surface and a second surface opposite to the first surface; a plurality of first connecting members on the first surface of the package substrate; an interposer substrate on the second surface of the package substrate, and connected to the package substrate via a plurality of intermediate connecting members on the second surface; a first semiconductor chip on the interposer substrate; a second semiconductor chip on the interposer substrate and set apart from the first semiconductor chip in a horizontal direction thereby forming a gap between the first semiconductor chip and the second semiconductor chip, wherein the first semiconductor chip and the second semiconductor chip each connected to a plurality of second connecting members and a plurality of third connecting members on the interposer substrate; a first thermal interface material layer formed in the gap; a second thermal interface material layer formed on each of the first semiconductor chip and the second semiconductor chip, the material composition of the second thermal interface material layer being different than the material composition of the first thermal interface material layer; and a heat spreader supported on the package substrate and contacting all of the first thermal interface material layer and the second thermal interface material layer formed on each of the first semiconductor chip and the second semiconductor chip while surrounding the interposer substrate, the first semiconductor chip, and the second semiconductor chip.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Below, the inventive concept will now be described more fully with reference to the accompanying drawings, in which example embodiments of the inventive concept are shown. The following embodiments of the present invention may be implemented by any one of them, and the following embodiments may be implemented by combining one or more of them. Therefore, the technical idea of the present invention is not limited to only one embodiment. In this specification, the singular forms of the components may include plural forms unless the context clearly indicates otherwise. In the present specification, the drawings are exaggerated for clarifying the inventive concept.

Figure 1:
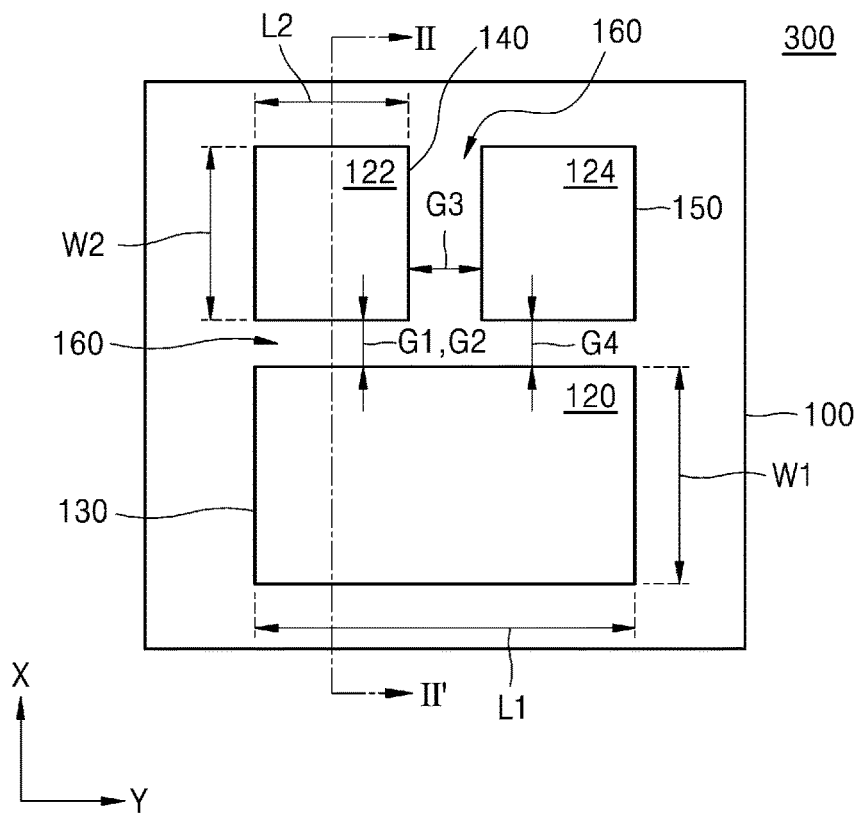
FIG. 1 is a plan view of a semiconductor package according to an embodiment of the inventive concept.

FIG. 1 is a plan view of a semiconductor package 300 according to an embodiment of the inventive concept.

The semiconductor package 300 may include at least two semiconductor chips. In the illustrative embodiment of FIG. 1, three semiconductor chips 130, 140, and 150, which are on a package substrate 100 and set apart from each other in a horizontal direction are shown. A size of the package substrate 100 may be several tens of mm in an X direction (for example, a width direction) and a Y direction (for example, a length direction). Below in the inventive concept, although the semiconductor package 300 is described as including three semiconductor chips 130, 140, and 150 for convenience, the semiconductor package 300 may include more semiconductor chips when needed.

In the semiconductor package 300, the semiconductor chip 130 may be set apart from the semiconductor chips 140 and 150 in the X direction. The semiconductor chip 140 may be set apart from the semiconductor chip 150 in the Y direction. In this case, the X direction or the Y direction may be horizontal directions with respect to the package substrate 100.

The semiconductor chips 130, 140, and 150 may hereafter be referred to as a first semiconductor chip 130, a second semiconductor chip 140, and a third semiconductor chip 150, respectively. In some embodiments, each of the first semiconductor chip 130, the second semiconductor chip 140, and the third semiconductor chip 150 may be one chip mounted on the package substrate 100, that is, a single unstacked chip. In some embodiments, each of the first semiconductor chip 130, the second semiconductor chip 140, and the third semiconductor chip 150 may comprise multiple chips mounted on the package substrate 100, that is, a stacked chip. Below in the inventive concept, in the semiconductor package 300, the semiconductor chips 130, 140, and 150 are described as single unstacked chips, but may be described as stacked chips when needed.

In the semiconductor package 300, a size of the first semiconductor chip 130 may be greater than the size of the second semiconductor chip 140 and the third semiconductor chip 150. In some embodiments, a width W1 of the first semiconductor chip 130 in the X direction in FIG. 1, for example, of several tens of mm, may be greater than a width W2 of the second semiconductor chip 140, for example, of several mm, and a length L1 of the first semiconductor chip 130 in the Y direction, for example, of several tens of mm, may be greater than a length L2 of the second semiconductor chip 140, for example, of several mm. The third semiconductor chip 150 may have the same width and length as the second semiconductor chip 140.

In some embodiments, the first semiconductor chip 130 may include a control chip. In some embodiments, the second semiconductor chip 140 and/or the third semiconductor chip 150 may include memory chips. In some embodiments, the third semiconductor chip 150 may include a communication chip for communicating with an external device. In some embodiments, the third semiconductor chip 150 may include a power management chip that provides power to the first semiconductor chip 130 and/or the second semiconductor chip 140.

In some embodiments, the first semiconductor chip 130 may include a microcontroller (or a microprocessor) for driving or controlling the semiconductor package 300. In some embodiments, the second semiconductor chip 140 and/or the third semiconductor chip 150 may include a memory chip, such as a flash memory, dynamic random access memory (RAM) (DRAM), static RAM (SRAM), erasable programmable read only memory (ROM) (EPROM), electrically erasable programmable ROM (EEPROM), flash EEPROM, magnetic RAM (MRAM), phase change RAM (PRAM), resistive RAM (RRAM), high bandwidth memory (HBM), and a hybrid memory cube (HMC).

In the semiconductor package 300, first thermal interface material layers 160 having a first elastic modulus may be in a first gap G1 between the first semiconductor chip 130 and the second semiconductor chips 140 in the X direction, a third gap G3 between the second semiconductor chip 140 and the third semiconductor chip 150 in the Y direction, and a fourth gap G4 between the first semiconductor chip 130 and the third semiconductor chip 150 in the X direction.

Sizes of the first and fourth gaps G1 and G4 may be different from that of the third gap G3. For example, the sizes of the first gap G1 and the fourth gap G4 (that is, the width in the X direction) may be less than the size of the third gap G3 (that is, the length in the Y direction). When needed, the sizes of the first gap G1 and the fourth gap G4 (that is, the width in the X direction) may be the same as that of the third gap G3 (that is, the length in the Y direction). When the first thermal interface material layers 160 are arranged, heat generated inside the semiconductor package 300 may be easily discharged to the outside.

In the semiconductor package 300, second thermal interface material layers 120, 122, and 124 having a second elastic modulus may be on the first semiconductor chip 130, the second semiconductor chip 140, and the third semiconductor chip 150. The second thermal interface material layers 120, 122, and 124 may include a material different from the first thermal interface material layers 160. The material composition of the second thermal interface material layers 120, 122, and 124 may be different from the material composition of the first thermal interface material layers 160. The first elastic modulus of the first thermal interface material layers 160 may be less than the second elastic modulus of the second thermal interface material layers 120, 122, and 124.

The second thermal interface material layers 120 and 122 may be set apart from each other by a second gap G2 between the first semiconductor chip 130 and the second semiconductor chips 140. The second gap G2 may be the same as the first gap G1. The second thermal interface material layers 122 and 124 may be set apart from each other by the third gap G3 between the second semiconductor chip 140 and the third semiconductor chip 150.

When the second thermal interface material layers 120, 122, and 124 are arranged, heat generated inside the semiconductor package 300 may be easily discharged to the outside. Arrangement relationships, functions, and effects of the first thermal interface material layers 160 and the second thermal interface material layers 120, 122, and 124 are described in more detail with reference to FIGS. 2A and 2B.

Figure 2A:
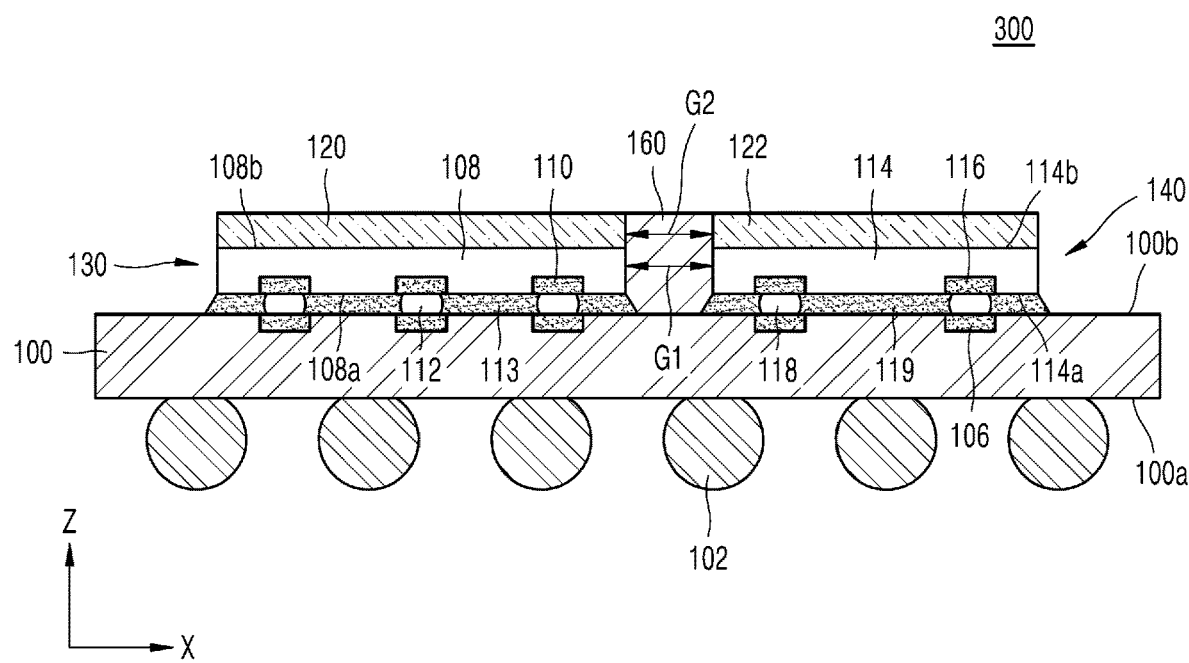
FIG. 2A is a cross-sectional view of a semiconductor package taken along line II-II' in FIG. 1.
Figure 2B:
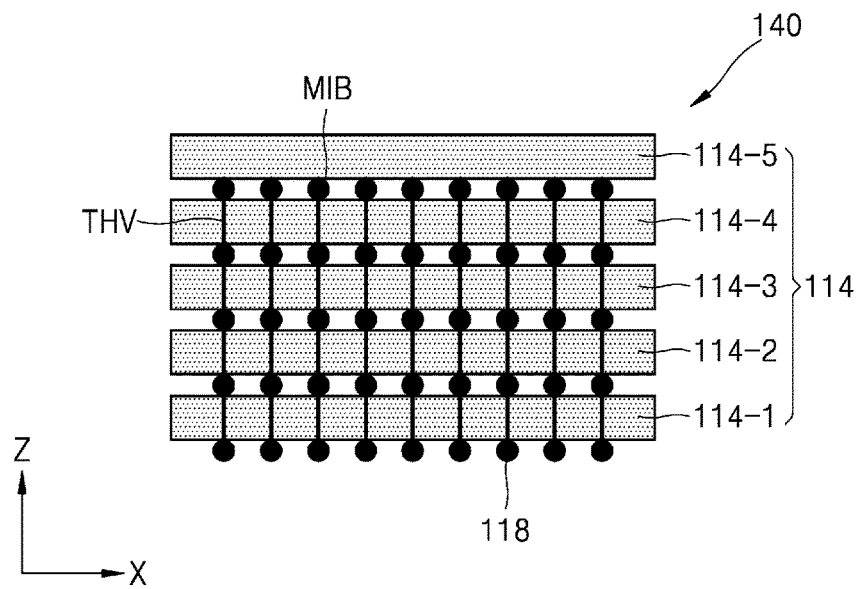
FIG. 2B is a cross-sectional view of an example of a second semiconductor chip in FIG. 2A.

FIG. 2A is a cross-sectional view of a semiconductor package taken along line II-II' in FIG. 1, and FIG. 2B is a cross-sectional view of an example of a second semiconductor chip in FIG. 2A.

On the semiconductor package 300, the X direction may be a horizontal direction with respect to the package substrate 100, and a Z direction may be a vertical direction with respect to the package substrate 100. As described above, the first semiconductor chip 130 may include a microcontroller (or a microprocessor). The first semiconductor chip 130 may include a single chip or a stacked chip. As described above, the second semiconductor chip 140 may include a memory chip. The second semiconductor chip 140 may include a single chip or a stacked chip.

In FIG. 2B, a High Bandwidth Memory (HBM) or a Hybrid Memory Cube (HMC) are presented as an example of the second semiconductor chip 140. The second semiconductor chip 140 illustrated in FIG. 2B may include memory chips 114-2 through 114-5 stacked on a logic chip 114-1. The memory chips 114-2 through 114-5 and the logic chip 114-1 may constitute a second chip body 114.

In FIG. 2B, a size of the logic chip 114-1, for example, a width in the X direction, is illustrated as being the same as sizes of the memory chips 114-2 through 114-5, for example, the width in the X direction. However, the size of the logic chip 114-1, for example, the width in the X direction, may be greater than the size of the memory chips 114-2 through 114-5, for example, the width in the X direction.

In FIG. 2B, four memory chips 114-2 through 114-5 may be stacked, but eight or more memory chips may be stacked when needed. The logic chip 114-1 and the memory chips 114-2 through 114-5 may be connected to through vias THV and bumps MIB. The through vias THV may be electrically connected to third connecting members 118 formed on one surface of the logic chip 114-1. In FIG. 2B, the through vias THV and the bumps MIB may be formed in the entire area (or the entire surface) of the logic chip 114-1 and the memory chips 114-2 through 114-4, but when needed, the through vias THV and the bumps MIB may be partially formed in the area of logic chip 114-1 and the memory chips 114-2 through 114-4.

Referring again to FIG. 2A, in the description of the semiconductor package 300, the first semiconductor chip 130 and the second semiconductor chip 140 are described by using a single chip for convenience. The inventive concept may be applied when the heights of the first semiconductor chip 130 and the second semiconductor chip 140 are substantially the same, regardless of whether the first semiconductor chip 130 and the second semiconductor chip 140 include single chips or stacked chips.

In the semiconductor package 300, the package substrate 100 may include a printed circuit board (PCB). In some embodiments, the package substrate 100 may include a wiring board. The package substrate 100 may include a first surface 100a and a second surface 100b opposite to the first surface 100a. The first surface 100a may be referred to as a lower surface, and the second surface 100b may be referred to as an upper surface. A plurality of first connecting members 102 electrically connected to an external device may be on the first surface 100a of the package substrate 100.

The first connecting members 102 may be referred to as external connecting members or first connection terminals. The first connecting members 102 may include or may be formed of a solder material such as a solder ball, a solder bump, and a solder paste, or a metal material having a spherical shape, a mesa shape, or a pin shape.

A plurality of substrate pads 106 may be on the second surface 100b of the package substrate 100. The plurality of substrate pads 106 may be on the second surface 100b or near the second surface 100b. The first semiconductor chip 130 may be mounted on some of the plurality of substrate pads 106 of the package substrate 100 via a plurality of second connecting members 112. The first semiconductor chip 130 may include a first chip body 108 having a first surface 108a and a second surface 108b opposite to the first surface 108a, and a first chip pad 110 on the first surface 108a. The first surface 108a and the second surface 108b may be referred to as a lower surface and an upper surface, respectively. The first chip pad 110 may be on or near the first surface 108a.

The first surface 108a may be an active surface on which transistors are formed. In the first semiconductor chip 130, the first chip pad 110 and the second connecting members 112, which are on the first surface 108a, may be connected to each other. The second connecting members 112 may include the same material as the first connecting members 102. A space between the second connection members 112 on the package substrate 100 may be filled with a first underfill material 113. The first underfill material 113 may include or may be formed of a resin such as an epoxy resin.

The second semiconductor chip 140 may be mounted on some of the plurality of substrate pads 106 of the package substrate 100 via a plurality of third connecting members 118. The second semiconductor chip 140 may be mounted apart from the first semiconductor chip 130 horizontally, that is, in the X direction, on the package substrate 100. The second semiconductor chip 140 may include a second chip body 114 including a first surface 114a and a second surface 114b opposite to the first surface 114a, and a second chip pad 116 on the first surface 114a. The first surface 114a and the second surface 114b may be referred to as a lower surface and an upper surface, respectively. The second chip pad 116 may be on or near the first surface 114a.

The first surface 114a may be an active surface on which transistors are formed. In the second semiconductor chip 140, the second chip pad 116 and the third connecting members 118, which are on the first surface 114a, may be connected to each other. The third connecting members 118 may include or may be formed of the same material as the first connecting members 102. A space between the third connection members 118 on the package substrate 100 may be filled with a second underfill material 119. The second underfill material 119 may include or may be formed of the same material as the first underfill material 113. In the semiconductor package 300, a height of the first semiconductor chip 130 may be substantially the same as a height of the second semiconductor chip 140.

In FIG. 2A, it is illustrated that the first underfill material 113 and the second underfill material 119 protrude outward from both sides of the first chip body 108 and the second chip body 114, respectively. However, the first underfill material 113 and the second underfill material 119 may not protrude from both sides of the first chip body 108 and the second chip body 114, respectively.

In the semiconductor package 300, the first thermal interface material layer 160 may be formed in the first gap G1 between the first semiconductor chip 130 and the second semiconductor chip 140 such that a lower surface of the first thermal interface material layer 160 is in contact with the second surface 100b of the package substrate 100. In some embodiments, the first thermal interface material layer 160 may fill in the first gap G1 such that an upper surface of the first thermal interface layer 160 is substantially coplanar with an upper surface of the second thermal interface material layer 120 and an upper surface of the second thermal interface material layer 122. Because the first and second underfill materials 113 and 119 penetrate into the first gap G1, an upper width of the first thermal interface material layer 160 may be greater than a lower width (that is, a bottom width) thereof. The first thermal interface material layer 160 may have a first modulus of elasticity. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

In the semiconductor package 300, the second thermal interface material layers 120 and 122 may be on the first and second semiconductor chips 130 and 140, respectively. The second thermal interface material layers 120 and 122 may be arranged entirely on the second surfaces 108b and 114b, that is, the upper surfaces, of the first and second semiconductor chips 130 and 140, respectively. The second thermal interface material layers 120 and 122 may each include a different material than that of the first thermal interface material layer 160, and may be set apart from each other by the second gap G2. The size of the second gap G2 may be the same as the size of the first gap G1 between the first semiconductor chip 130 and the second semiconductor chip 140. The first thermal interface material layer 160 may be formed in the second gap G2 as well. The second thermal interface material layers 120 and 122 may have a second modulus of elasticity. The top surface of the first thermal interface material layer 160 described above may be substantially coplanar with the surfaces of the second thermal interface material layers 120 and 122.

In the semiconductor package 300, the first elastic modulus of the first thermal interface material layer 160 may be configured to be less than the second elastic modulus of the second thermal interface material layers 120 and 122. In other words, the second elastic modulus of the second thermal interface material layers 120 and 122 may be configured to be greater than the first elastic modulus of the first thermal interface material layer 160.

The first thermal interface material layer 160 and the second thermal interface material layers 120 and 122 may include a material having better heat transfer than air, and thus, may easily discharge heat generated in package components constituting the semiconductor package 300, for example, the package substrate 100, and the first and second semiconductor chips 130 and 140.

The first thermal interface material layer 160 and the second thermal interface material layers 120 and 122 may have adhesive properties. The first thermal interface material layer 160 and the second thermal interface material layers 120 and 122 may include or may be formed of an adhesive material, and may be formed on a space between the first and second semiconductor chips 130 and 140 or on the first and second semiconductor chips 130 and 140.

The first thermal interface material layer 160 and the second thermal interface material layers 120 and 122 may include a base material and a filler included in the base material. The base material may include or may be formed of a polymer or a resin. The resin may include or may be formed of a silicone resin, an acrylic resin, or an epoxy resin. The filler may include or may be formed of a dielectric filler such as aluminum oxide, magnesium oxide, aluminum nitride, boron nitride, zinc oxide, and diamond powder.

The filler may include or may be formed of a metal filler such as silver, copper, and aluminum. The filler may include thermally conductive particles including the above-described materials. In some embodiments, the first thermal interface material layer 160 may include or may be formed of a silicone-based resin or an acrylic resin, and the second thermal interface material layers 120 and 122 may include or may be formed of a silicone-based resin or an epoxy-based resin.

As described above, the first elastic modulus of the first thermal interface material layer 160 may be less than the second elastic modulus of the second thermal interface material layers 120 and 122. In some embodiments, the first elastic modulus of the first thermal interface material layer 160 and the second elastic modulus of the second thermal interface material layers 120 and 122 may vary based on a type or an amount of the filler. In addition, the thermal conductivity of the first thermal interface material layer 160 may be greater than that of the second thermal interface material layers 120 and 122.

In some embodiments, the first elastic modulus of the first thermal interface material layer 160 may be about 3 MPa or less, and the second modulus of elasticity of the second thermal interface material layers 120 and 122 may be about 20 MPa or more. The thermal conductivity of the first thermal interface material layer 160 and the second thermal interface material layers 120 and 122 may be within a range of about 1.5 to about 4 mW/K. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Benefits of forming the first thermal interface material layer 160 having the first elastic modulus less than the second elastic modulus of the second thermal interface material layers 120 and 122 between the first and second semiconductor chips 130 and 140 in the semiconductor package 300 are described below.

In the semiconductor package 300, warpage, that is, strain, may occur due to differences in coefficients of thermal expansion (CTE) of package components during a package manufacturing process or package use. When warpage occurs, and the first thermal interface material layer 160 having a low elastic modulus is formed in the first gap G1 between the first and second semiconductor chips 130 and 140, the stress applied to the semiconductor package 300 may be reduced.

On the other hand, when a thermal interface material layer having a high elastic modulus is formed in the first gap G1 between the first and second semiconductor chips 130 and 140, large stress may be applied to the semiconductor package 300. When the large stress is applied thereto, the semiconductor package 300 may be delaminated from the package components such as the first and second semiconductor chips 130 and 140, or cracks may occur in the package components such as the first and second underfill materials 113 and 119.

In addition, when the first thermal interface material layer 160 having the first elastic modulus less than the second elastic modulus is formed between the first and second semiconductor chips 130 and 140 in the semiconductor package 300, heat generated in the semiconductor package 300, for example, the first and second semiconductor chips 130 and 140, may be more easily discharged.

In other words, because the first thermal interface material layer 160 having the first elastic modulus and located between the first and second semiconductor chips 130 and 140 has greater thermal conductivity than the second thermal interface material layers 120 and 122 having the second elastic modulus on the first and second semiconductor chips 130 and 140, heat generated in the first and second semiconductor chips 130 and 140 may be more easily discharged.

A manufacturing process of the semiconductor package 300 may include an operation of forming the first thermal interface material layer 160, which is adhesive, in the first gap G1 between the first and second semiconductor chips 130 and 140 mounted on the package substrate 100, an operation of forming the second thermal interface material layers 120 and 122, which are adhesive, on the first and second semiconductor chips 130 and 140, and an operation of curing the first thermal interface material layer 160 and the second thermal interface material layers 120 and 122.

In this manner, the semiconductor package 300 of the inventive concept may improve the package reliability by more easily discharging heat generated in the first and second semiconductor chips 130 and 140, while preventing the package components from being separated or cracking.

Figure 3:
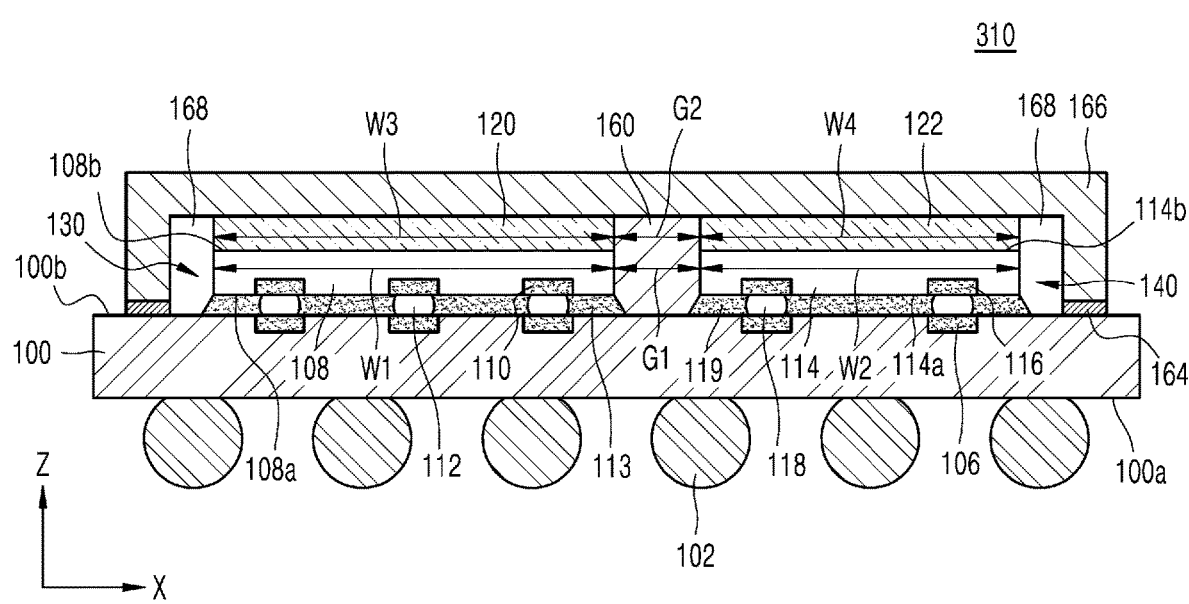
FIG. 3 is a cross-sectional view of a semiconductor package according to an embodiment of the inventive concept.

FIG. 3 is a cross-sectional view of a semiconductor package 310 according to an embodiment of the inventive concept.

The semiconductor package 310 in FIG. 3 may be the same as the semiconductor package 300 in FIG. 2 except that the semiconductor package 310 of FIG. 3 further includes a heat spreader 166. With respect to the description of FIG. 3 provided below, the same concepts described above with reference to FIG. 2 are only briefly described or omitted for the purpose of brevity.

The semiconductor package 310 may include the package substrate 100, the first and second semiconductor chips 130 and 140, the first thermal interface material layer 160, the second thermal interface material layers 120 and 122, and the heat spreader 166.

In some embodiments, in the semiconductor package 310, the first chip body 108 of the first semiconductor chip 130 may have a width W1. In the semiconductor package 310, a width W3 of the second thermal interface material layer 120 on the first chip body 108 may be the same as the width W1 of the first chip body 108 of the first semiconductor chip 130.

In the semiconductor package 310, the second chip body 114 of the second semiconductor chip 140 may have the width W2. In the semiconductor package 310, a width W4 of the second thermal interface material layer 122 on the second chip body 114 may be the same as the width W2 of the first chip body 114 of the second semiconductor chip 140.

Accordingly, an area (or a lower surface area) of the second thermal interface material layer 120 may be the same as an area (or an upper surface area) of the first chip body 108. An area (or a lower surface area) of the second thermal interface material layer 122 may be the same as an area (or an upper surface area) of the second chip body 114.

The heat spreader 166 may be adhered to and supported on the second surface 100b, that is, the upper surface, of the package substrate 100 via an adhesive layer 164. For example, the heat spreader may be in contact with a first surface of the adhesive layer 164 and a second surface of the adhesive layer 164 may be in contact with the second surface of the package substrate 100. The heat spreader 166 may include or may be formed of a material such as copper (Cu), iron (Fe), nickel (Ni), cobalt (Co), tungsten (W), chromium (Cr) silver (Ag), gold (Au), platinum (Pt), tin (Sn), aluminum (Al), magnesium (Mg), silicon (Si), zinc (Zn), or a combination thereof.

The heat spreader 166 may surround the first and second semiconductor chips 130 and 140. The heat spreader 166 may be set apart from both edges of the first and second semiconductor chips 130 and 140 such that a separation space 168 may be provided between the heat spreader 166 and both edges of the first and second semiconductor chips 130 and 140.

The heat spreader 166 may contact all the first thermal interface material layer 160 and the second thermal interface material layers 120 and 122. Specifically, the heat spreader 166 may contact upper surfaces of the first thermal interface material layer 160 and the second thermal interface material layers 120 and 122. Because the heat spreader 166 is in contact with the first thermal interface material layer 160 and the second thermal interface material layers 120 and 122, heat may be more easily discharged from the first thermal interface material layer 160 and the second thermal interface material layers 120 and 122. When an element is referred to as "contacting" or "in contact with" another element, there are no intervening elements present at the point of contact.

A manufacturing process of the semiconductor package 310 may include an operation of forming the first thermal interface material layer 160, which is adhesive, in the first gap G1 between the first and second semiconductor chips 130 and 140, an operation of forming the second thermal interface material layers 120 and 122 on the first and second semiconductor chips 130 and 140, which are adhesive, and an operation of compressing the heat spreader 166 including the adhesive layer 164 on the package substrate 100 and curing the first thermal interface material layer 160 and the second thermal interface material layers 120 and 122.

The semiconductor package 310 described above may greatly improve the package reliability by more easily discharging heat generated from the package components, while further preventing a separation phenomenon or a cracking phenomenon of the package components described above.

Figure 4A:
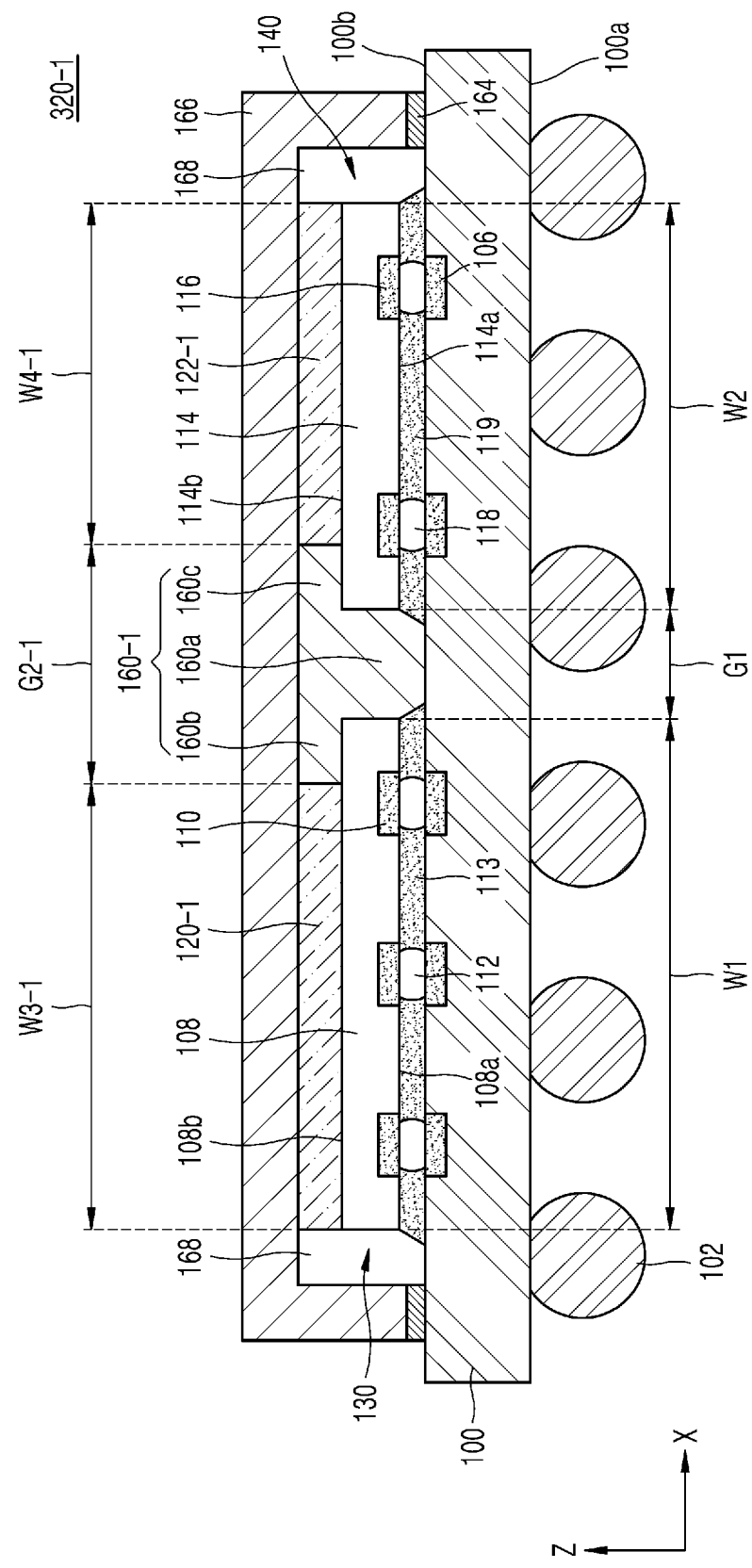
FIGS. 4A through 4C are cross-sectional views of semiconductor packages according to embodiments of the inventive concept, respectively.
Figure 4B:
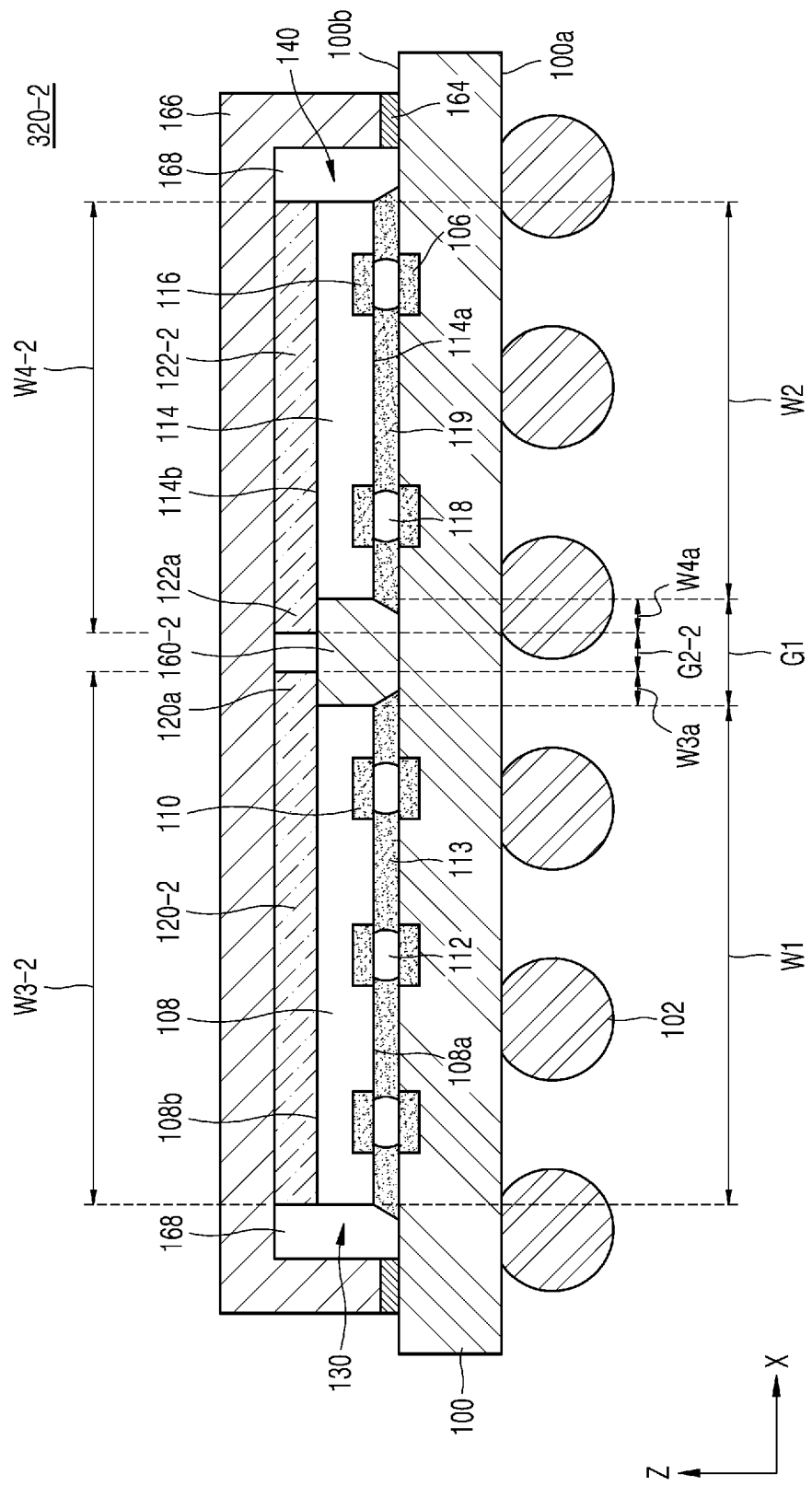
Figure 4C:
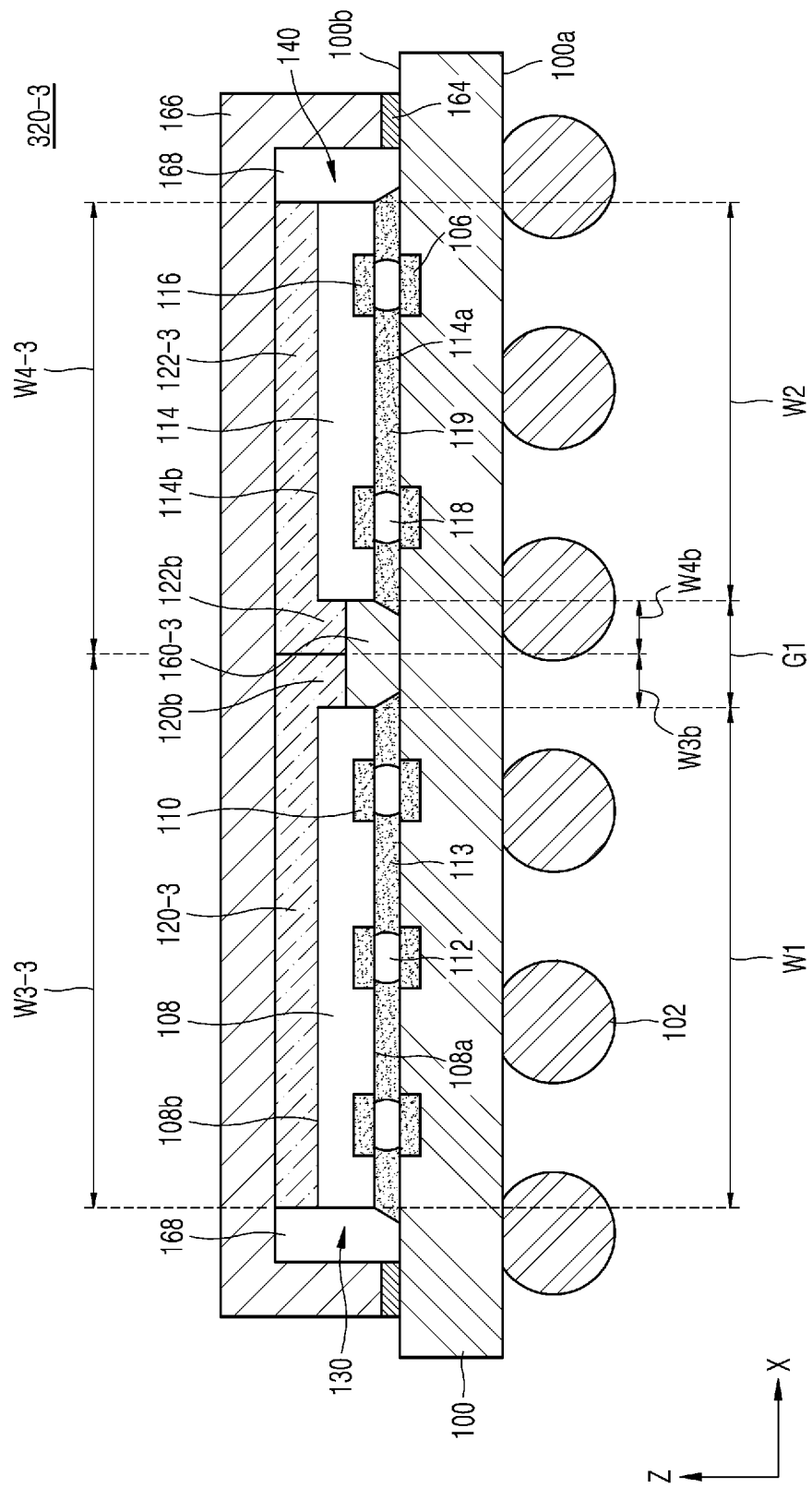

FIGS. 4A through 4C are cross-sectional views of semiconductor packages 320-1, 320-2, and 320-3, according to embodiments of the inventive concept, respectively.

The semiconductor packages 320-1, 320-2, and 320-3 may be the same as the semiconductor package 310 of FIG. 3 except that formation locations of first thermal interface material layers 160-1, 160-2, and 160-3 and formation positions of second thermal interface material layers 120-1, 120-2, 120-3, 122-1, 122-2, and 123-3 are different. With respect to the description of FIGS. 4A through 4C provided below, the same descriptions provided above with reference to FIG. 3 are only briefly described or omitted for the purpose of brevity.

Referring to FIG. 4A, the first thermal interface material layer 160-1 of the semiconductor package 320-1 may be partially extended onto the upper surfaces of the first and second semiconductor chips 130 and 140. Specifically, the first thermal interface material layer 160-1 may be formed in the first gap G1, and may be partially extended onto second surfaces 108*b* and 114*b* of the first and second semiconductor chips 130 and 140, respectively.

The first thermal interface material layer 160-1 may include a first portion 160*a* formed in the first gap G1 such that a lower surface of the first thermal interface material layer 160 is in contact with the second surface 100*b* of the package substrate 100, a second portion 160*b* formed on a portion of the second surface 108*b* of the first semiconductor chip 130, and a third portion 160*c* formed on a portion of the second surface 114*b* of the second semiconductor chip 140. Accordingly, the second thermal interface material layers 120-1 and 122-1 may be set apart from each other by a second gap G2-1. A size of the second gap G2-1 may be greater than the size of the first gap G1 between the first semiconductor chip 130 and the second semiconductor chip 140.

In addition, in the semiconductor package 320-1, a width W3-1 of a second thermal interface material layer 120-1 on the first chip body 108 may be less than the width W1 of the first chip body 108 of the first semiconductor chip 130. In the semiconductor package 320-1, a width W4-1 of the second thermal interface material layer 122-1 on the second chip body 114 may be less than the width W2 of the first chip body 114 of the second semiconductor chip 140.

Accordingly, an area (or a lower surface area) of the second thermal interface material layer 120-1 may be less than an area (or an upper surface area) of the first chip body 108. In some embodiments, the area (or the lower surface area) of the second thermal interface material layer 120-1 may be greater than or equal to about 70% of the area (or the upper surface area) of the first chip body 108.

The area (or the lower surface area) of the second thermal interface material layer 122-1 may be less than the area (or the upper surface area) of the second chip body 114. In some embodiments, the area (or the lower surface area) of the second thermal interface material layer 122-1 may be greater than or equal to about 70% of the area (or the upper surface area) of the first chip body 108.

The manufacturing process of the semiconductor package 320-1 may be the same as that of FIG. 3 except that a sufficient amount (i.e., an amount in excess of the volume capacity of the first gap G1) of the adhesive first thermal interface material layer 160-1 is formed in the first gap G1 between the first and second semiconductor chips 130 and 140. When the sufficient amount of the first thermal interface material layer 160-1, which is adhesive, is formed in the first gap G1 between the first and second semiconductor chips 130 and 140, the first thermal interface material layer 160-1 may extend onto a portion of the upper surfaces of the first and second semiconductor chips 130 and 140.

Referring to FIG. 4B, the first thermal interface material layer 160-2 of the semiconductor package 320-2 may be formed in the first gap G1 at the same height as the upper surfaces of the first chip body 108 and the second chip 114. The second thermal interface material layers 120-2 and 122-2 may extend partially onto the upper surface of the first thermal interface material layer 160-2. The second thermal interface material layers 120-2 and 122-2 may respectively include portions 120*a* and 122*a* that partially extend onto the upper surface of the first thermal interface material layer 160-2. The portions 120*a* and 122*a* that partially extend onto the upper surface of the first thermal interface material layer 160-1 may have widths W3*a* and W4*a*, respectively.

Accordingly, the second thermal interface material layers 120-2 and 122-2 may be set apart from each other by a second gap G2-2. A size of the second gap G2-2 may be less than the size of the first gap G1 between the first semiconductor chip 130 and the second semiconductor chip 140.

In addition, in the semiconductor package 320-2, a width W3-2 of the second thermal interface material layer 120-2 on the first chip body 108 may be greater than the width W1 of the first chip body 108 of the first semiconductor chip 130. In some embodiments, the width W3*a* of the portion 120*a* of the second thermal interface material layer 120-2 that extends onto the upper surface of the first thermal interface material layer 160-2 may be about 10%, for example, less than or equal to about 10% of the width W1 of the first chip body 108 of the first semiconductor chip 130.

In the semiconductor package 320-2, a width W4-2 of the second thermal interface material layer 122-2 on the second chip body 114 may be greater than the width W2 of the first chip body 114 of the second semiconductor chip 140. In some embodiments, a width W4*a* of the portion 122*a* of the second thermal interface material layer 122-2 that extends onto the upper surface of the first thermal interface material layer 160-2 may be about 10%, for example, less than or equal to about 10% of the width W2 of the second chip body 114 of the second semiconductor chip 140.

Accordingly, the area (or the lower surface area) of the second thermal interface material layer 120-2 may be greater than the area (or the upper surface area) of the first chip body 108. In some embodiments, the area (or the lower surface area) of the second thermal interface material layer 120-2 may be about 10% (for example, less than or equal to 10%) of the area (or the upper surface area) of the first chip body 108.

The area (or the lower surface area) of the second thermal interface material layer 122-2 may be greater than the area (or the upper surface area) of the second chip body 114. In some embodiments, the area (or the lower surface area) of the second thermal interface material layer 122-2 may be about 10% (for example, less than or equal to 10%) of the area (or the upper surface area) of the second chip body 114.

A manufacturing process of the semiconductor package 320-2 may be the same as that of FIG. 3 except that a smaller amount of the first thermal interface material layer 160-2, which is adhesive, is formed in the first gap G1 between the first and second semiconductor chips 130 and 140, such that an upper surface of the first thermal interface material layer 160-2 is substantially coplanar with the second surfaces 108*b* and 114*b* of the first and second semiconductor chips 130 and 140, respectively. When the first thermal interface material layer 160-2, which is adhesive, is formed in the first gap G1 between the first and second semiconductor chips 130 and 140, the second thermal interface material layers 120-2 and 122-2 may be extended onto a portion on the first thermal interface material layer 160-2.

Referring to FIG. 4C, the first thermal interface material layer 160-3 of the semiconductor package 320-3 may not completely fill in the first gap G1. That is, the amount of the first thermal interface material layer 160-3 included in the first gap G1 may be less than the volume capacity of the first gap G1. Accordingly, the upper surface of the first thermal interface material layer 160-3 may be lower than the second surfaces 108b and 114b of the first and second semiconductor chips 130 and 140, respectively.

The second thermal interface material layers 120-3 and 122-3 may be extended onto the upper surface of the first thermal interface material layer 160-3, while covering side surfaces of the first chip body 108 and the second chip body 114. The second thermal interface material layers 120-3 and 122-3 may include portions 120b and 122b that partially extend onto the upper surface of the first thermal interface material layer 160-3, respectively. The portions 120b and 122b extended onto the upper surface of the first thermal interface material layer 160-3 may contact each other. The portions 120b and 122b that partially extend onto the upper surface of the first thermal interface material layer 160-3 may have widths W3b and W4b, respectively.

Accordingly, the second thermal interface material layers 120-3 and 122-3 may contact each other. In the semiconductor package 320-3, a width W3-3 of the second thermal interface material layer 120-3 on the first chip body 108 may be greater than the width W1 of the first chip body 108 of the first semiconductor chip 130. In some embodiments, the width W3b of the portion 120b of the second thermal interface material layer 120-3 that extends onto the upper surface of the first thermal interface material layer 160-3 may be about 10%, for example, less than or equal to about 10%, of the width W1 of the first chip body 108 of the first semiconductor chip 130.

In the semiconductor package 320-3, a width W4-3 of the second thermal interface material layer 122-3 on the second chip body 114 may be greater than the width W2 of the first chip body 114 of the second semiconductor chip 140. In some embodiments, the width W4b of the portion 122b of the second thermal interface material layer 122-3 that extends onto the upper surface of the first thermal interface material layer 160-3 may be about 10%, for example, less than or equal to about 10%, of the width W2 of the second chip body 114 of the second semiconductor chip 140.

Accordingly, the area (or the lower surface area) of the second thermal interface material layer 120-3 may be greater than the area (or the upper surface area) of the first chip body 108. In some embodiments, the area (or the lower surface area) of the second thermal interface material layer 120-3 may be about 10% (for example, less than or equal to 10%) greater than the area (or the upper surface area) of the first chip body 108.

The area (or the lower surface area) of the second thermal interface material layer 122-3 may be greater than the area (or the upper surface area) of the second chip body 114. In some embodiments, the area (or the lower surface area) of the second thermal interface material layer 120-3 may be about 10% (for example, less than or equal to 10%) greater than the area (or the upper surface area) of the second chip body 114.

A manufacturing process of the semiconductor package 320-3 may be the same as that of FIG. 3 except that a smaller amount of the first thermal interface material layer 160-3, which is adhesive, is formed in the first gap G1 between the first and second semiconductor chips 130 and 140, such that the upper surface of the first thermal interface material layer 160-3 is lower than the second surfaces 108b and 114b of the first and second semiconductor chips 130 and 140, respectively. When the first thermal interface material layer 160-3 is formed in the first gap G1 between the first and second semiconductor chips 130 and 140, the thickness of the first thermal interface material layer 160-3 is smaller than the thickness of the first thermal interface material layer 160-2.

Figure 5:
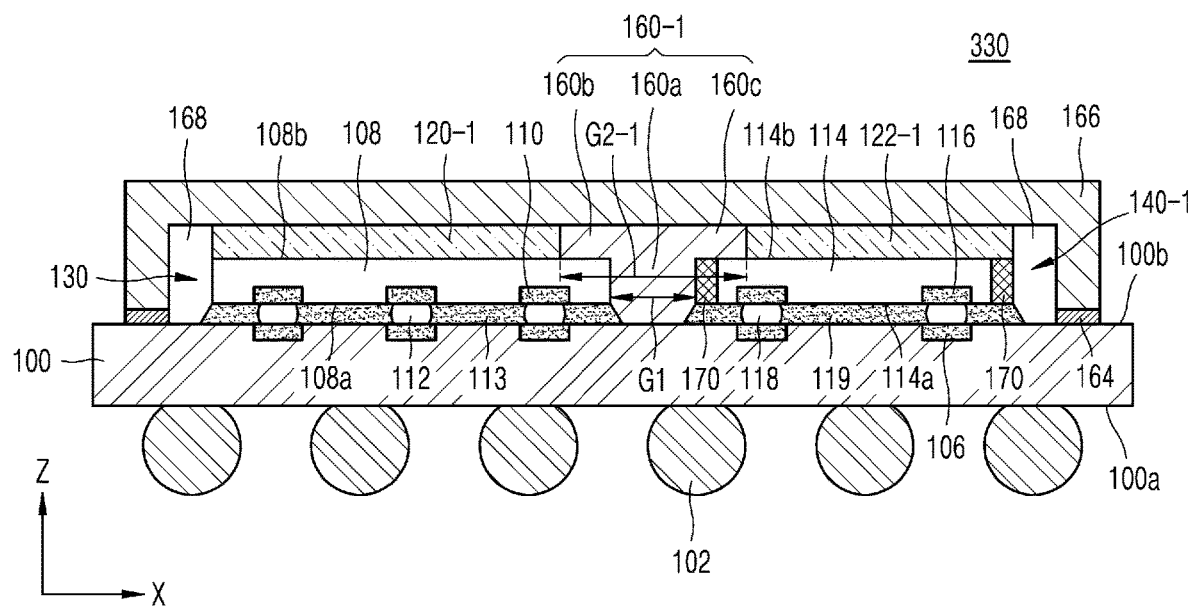
FIG. 5 is a cross-sectional view of a semiconductor package according to an embodiment of the inventive concept.

FIG. 5 is a cross-sectional view of a semiconductor package 330 according to an embodiment of the inventive concept.

The semiconductor package 330 may be the same as the semiconductor packages 320-1 in FIG. 4A, except that a molding layer 170 is included in the second semiconductor chip 140-1. With respect to the description of FIG. 5 provided below, the same descriptions provided above with reference to FIGS. 4A, 4B, and 4C are only briefly described or omitted for the purpose of brevity. In FIG. 5, the molding layer 170 is included in the second semiconductor chip 140-1, but a molding layer may also be formed in the first semiconductor chip 130 when needed.

The semiconductor package 330 may include the package substrate 100, the first semiconductor chip 130, the second semiconductor chip 140-1, the first thermal interface material layer 160-1, the second thermal interface material layers 120-1 and 122-1, and the heat spreader 166.

The molding layer 170 may be formed on both side surfaces of the second semiconductor chip 140-1. The molding layer 170 may include or may be formed of an epoxy resin. Because the second semiconductor chip 140-1 includes the molding layer 170, the second semiconductor chip 140-1 may be referred to as a sub-semiconductor package. The molding layer 170 may contact the first thermal interface material layer 160-1.

Although the semiconductor package 330 includes the second semiconductor chip 140-1 in which the molding layer 170, that is, the sub-semiconductor package is formed, the semiconductor package 330 may greatly improve the package reliability by preventing separation phenomenon or crack occurrence phenomenon of the package components described above, as well as easily discharging heat generated from the package components.

Figure 6:
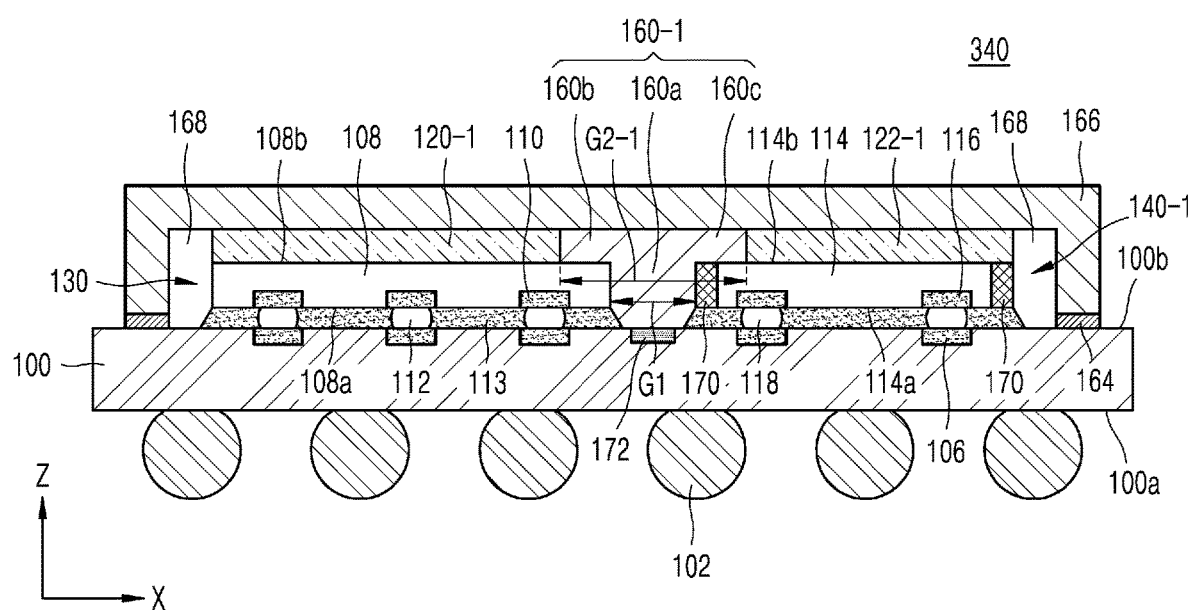
FIG. 6 is a cross-sectional view of a semiconductor package according to an embodiment of the inventive concept.

FIG. 6 is a cross-sectional view of a semiconductor package 340 according to an embodiment of the inventive concept.

The semiconductor package 340 may be the same as the semiconductor package 330 in FIG. 5 except that a heat transfer wiring pattern 172 is included in the package substrate 100. With respect to the description of FIG. 6 provided below, the same descriptions provided above with reference to FIG. 5 are only briefly described or omitted for the purpose of brevity.

The semiconductor package 340 may include the package substrate 100, the heat transfer wiring pattern 172, the first semiconductor chip 130, the second semiconductor chip 140-1, the first thermal interface material layer 160-1, the second thermal interface material layers 120-1 and 122-1, and the heat spreader 166.

The heat transfer wiring pattern 172 may be on the second surface 100b of the package substrate 100 or near the second surface 100b. The heat transfer wiring pattern 172 may be under the first gap G1. The heat transfer wiring pattern 172 may contact the first thermal interface material layer 160-1. The heat transfer wiring pattern 172 may contact the first portion 160a of the first thermal interface material layer 160-1. The heat transfer wiring pattern 172 may include or may be formed of a metal pattern.

By including the heat transfer wiring pattern 172 in contact with the first thermal interface material layer 160-1 on the package substrate 100, the semiconductor package 340 may greatly improve the package reliability by preventing separation phenomenon or cracking phenomenon of the package components described above, as well as more easily discharging heat generated from the package components.

Figure 7:
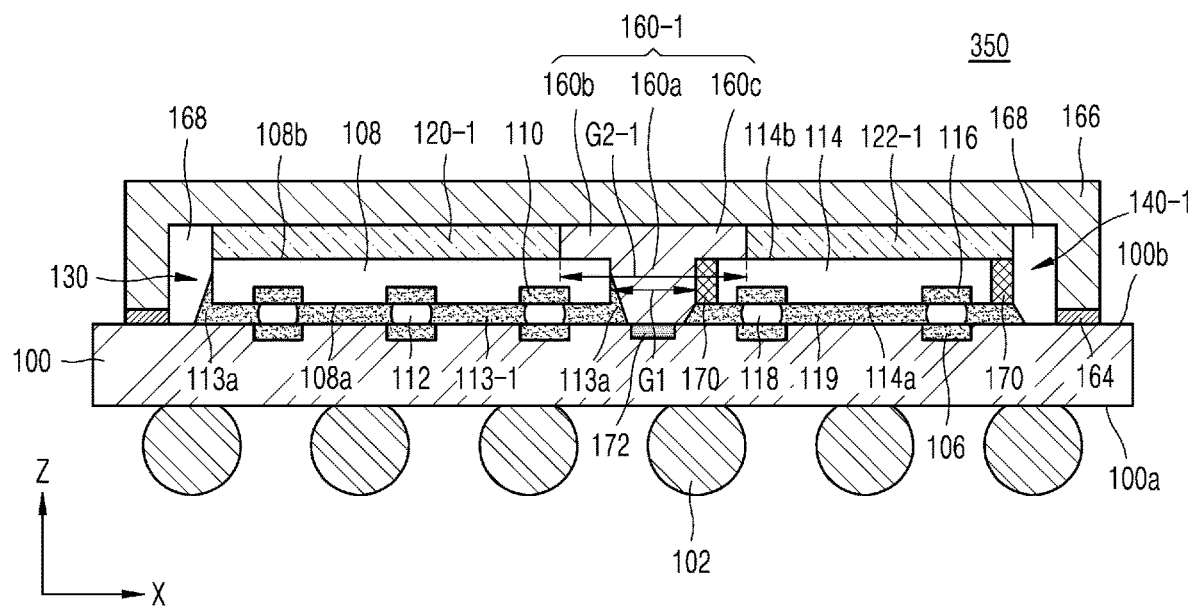
FIG. 7 is a cross-sectional view of a semiconductor package according to an embodiment of the inventive concept.

FIG. 7 is a cross-sectional view of a semiconductor package 350 according to an embodiment of the inventive concept.

The semiconductor package 350 may be the same as the semiconductor packages 340 in FIG. 6 except that a first underfill material 113-1 is on sidewalls of the first chip body 108. With respect to the description of FIG. 7 provided below, the same descriptions provided above with reference to FIG. 6 are only briefly described or omitted for the purpose of brevity.

The semiconductor package 350 may include the package substrate 100, the heat transfer wiring pattern 172, the first underfill material 113-1, the second underfill material 119, the first semiconductor chip 130, the second semiconductor chip 140-1, the first thermal interface material layer 160-1, the second thermal interface material layers 120-1 and 122-1, and the heat spreader 166.

A space between the second connection members 112 on the package substrate 100 may be filled with the first underfill material 113-1. The first underfill material 113-1 may include a portion 113a extended beyond the first surface 108a of the first chip body 108 and extended partially along a sidewall of the first chip body 108 facing away from the first gap G1. Portion 113a may also extend beyond the first surface 108a of the first chip body 108 and extend partially along a sidewall of the first chip body 108 facing towards the first gap G1. The first thermal interface material layer 160-1 may be formed in the first gap G1 on the portion 113a extended partially along a sidewall of the first chip body 108 facing towards the first gap G1. In other words, the portion 113a formed partially on the sidewall of the first semiconductor chip 130 facing towards the first gap G1 may contact the first thermal interface material layer 160-1 in the first gap G1.

In FIG. 7, although the first underfill material 113-1 is illustrated as being extended to the sidewall of the first chip body 108, the second underfill material 119 may not be extended along a sidewall of the second chip body 114. Instead, the second underfill material 119 may fill a space between the third connection members 118 and extend outward from both sides of the second chip body 114 and the respective molding layers 170. Specifically, the second underfill material 119 may extend beyond the sidewalls of the respective molding layers 170. When the molding layer 170 is not formed, the second underfill material 119 may be extended to the sidewall of the second chip body 114.

In the semiconductor package 350, the first underfill material 113-1 may be extended to the sidewall of the first chip body 108, and thus, the first semiconductor chip 130 may be stably mounted on the package substrate 100. In addition, the semiconductor package 350 may greatly improve the package reliability by preventing separation phenomenon or crack occurrence phenomenon of the package components described above, and easily discharging heat generated from the package components also.

Figure 8:
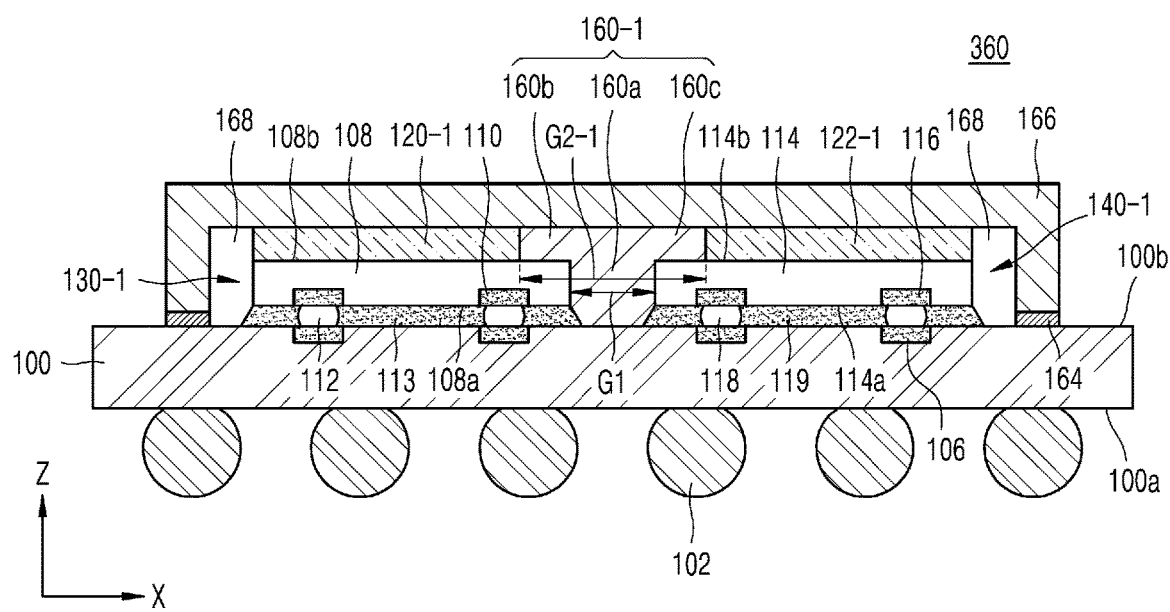
FIG. 8 is a cross-sectional view of a semiconductor package according to an embodiment of the inventive concept.

FIG. 8 is a cross-sectional view of a semiconductor package 360 according to an embodiment of the inventive concept.

The semiconductor package 360 may be the same as the semiconductor packages 320-1, 320-2, and 320-3 in FIGS. 4A, 4B, and 4C, respectively, except that the size of the first semiconductor chip 130-1 is smaller than the first semiconductor chip 130 in the semiconductor packages 320-1, 320-2, and 320-3. With respect to the description of FIG. 8 provided below, the same descriptions provided above with reference to FIGS. 4A, 4B, and 4C are only briefly described or omitted for the purpose of brevity.

The semiconductor package 360 may include the package substrate 100, the first semiconductor chip 130-1, the second semiconductor chip 140-1, the first thermal interface material layer 160-1, the second thermal interface material layers 120-1 and 122-1, and the heat spreader 166.

The first semiconductor chip 130-1 may have, for example, a width less than the first semiconductor chip 130-1 of FIGS. 4A, 4B, and 4C.

In this manner, regardless of the sizes of the first semiconductor chip 130-1 or the second semiconductor chip 140-1, the semiconductor package 360 may greatly improve the package reliability by preventing separation phenomenon or crack occurrence phenomenon of the package components described above, and easily discharging heat generated from the package components.

Figure 9:
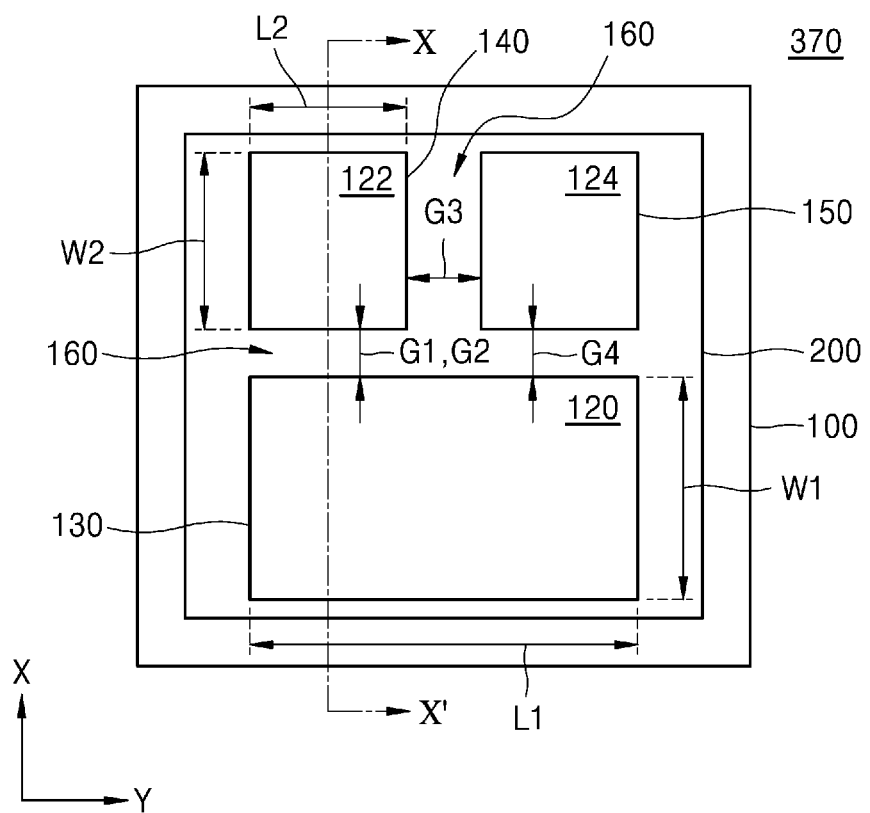
FIG. 9 is a plan view of a semiconductor package according to an embodiment of the inventive concept.

FIG. 9 is a plan view of a semiconductor package 370 according to an embodiment of the inventive concept.

The semiconductor package 370 may be the same as the semiconductor package 300 of FIG. 1 except that an interposer substrate 200 is further included. With respect to the description of FIG. 9 provided below, the same descriptions provided above with reference to FIG. 1 are only briefly described or omitted for the purpose of brevity.

The semiconductor package 370 may include the package substrate 100, the interposer substrate 200, the first and second semiconductor chips 130, 140, and 150, the first thermal interface material layer 160, and the second thermal interface material layers 120, 122, and 124. In the semiconductor package 370, the interposer substrate 200 may be mounted on the package substrate 100, and the semiconductor chips 130, 140, and 150 may be mounted on the interposer substrate 200.

The first thermal interface material layer 160 may be formed in the first gap G1, the third gap G3, and the fourth gap G4 between the semiconductor chips 130, 140, and 150, on the interposer substrate 200. The second thermal interface material layers 120, 122, and 124 may be formed on the semiconductor chips 130, 140, and 150, respectively.

The second thermal interface material layers 120 and 122 may be set apart from each other by the second gap G2 between the first semiconductor chip 130 and the second semiconductor chip 140, on the interposer substrate 200. The second thermal interface material layers 122 and 124 may be set apart from each other by the third gap G3 between the second semiconductor chip 140 and the third semiconductor chip 150, on the interposer substrate 200.

The arrangements and sizes of the semiconductor chips 130, 140, and 150 have been described with reference to FIG. 1, and thus description thereof are omitted. Although the semiconductor chips 130, 140, and 150 are mounted on the interposer substrate 200, the effects of the inventive concept described above with reference to FIG. 1 may be obtained in the semiconductor package 370.

Figure 10:
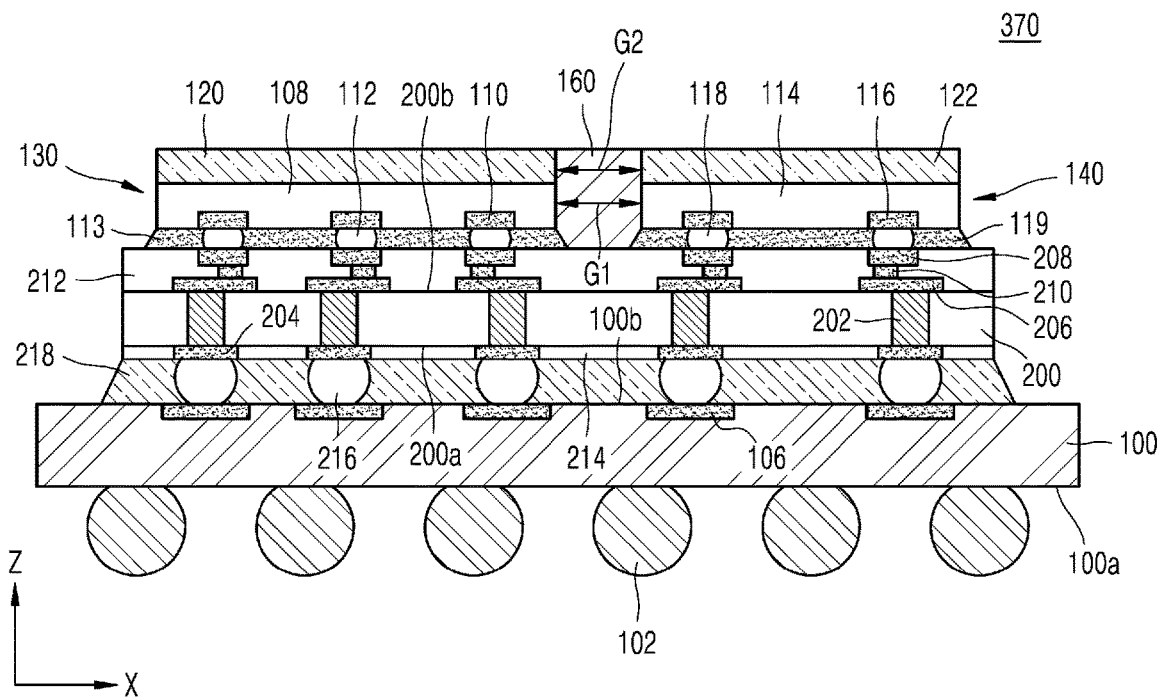
FIG. 10 is a cross-sectional view of a semiconductor package taken along line X-X' in FIG. 9.

FIG. 10 is a cross-sectional view of the semiconductor package 370 taken along line X-X' in FIG. 9.

The semiconductor package 370 may be the same as the semiconductor package 300 of FIGS. 2A and 2B except that an interposer substrate 200 is further included. With respect to the description of FIG. 10 provided below, the same descriptions provided above with reference to FIG. 2 are only briefly described or omitted for the purpose of brevity.

The semiconductor package 370 may include the package substrate 100, the interposer substrate 200, a lower redistribution layer 204, upper redistribution layers 206, 208, and 210, the first and second semiconductor chips 130 and 140, the first thermal interface material layer 160, and the second thermal interface material layers 120 and 122. In the semiconductor package 370, the interposer substrate 200 may be mounted on the package substrate 100. The interposer substrate 200 may include or may be formed of a silicon substrate.

The package substrate 100 may include the first surface 100a and the second surface 100b. The plurality of substrate pads 106 may be on the second surface 100b of the package substrate 100. The interposer substrate 200 may be mounted on some of the plurality of substrate pads 106 of the package substrate 100 via a plurality of intermediate connecting members 216. The intermediate connecting members 216 may include or may be formed of the same material as the first connecting members 102.

The interposer substrate 200 may include a first surface 200a and a second surface 200b opposite to the first surface 200a. The first surface 200a may be referred to as a lower surface. The second surface 200b may be referred to as an upper surface. The lower redistribution layer 204 (or a lower redistribution pad) may be on the first surface 200a of the interposer substrate 200. The lower redistribution layer 204 may be insulated by a lower redistribution insulating layer 214.

The upper redistribution layers 206, 208, and 210 may be on the second surface 200b of the interposer substrate 200. The upper redistribution layers 206, 208, and 210 may be insulated by an upper redistribution insulating layer 212. The upper redistribution layers 206, 208, and 210 may include the first upper redistribution layer 206 (or a first upper redistribution pad), the second upper redistribution layer 208 (or a second upper redistribution pad), and the redistribution vias 210 connecting the first upper redistribution layer 206 to the second upper redistribution layer 208.

In the present embodiment, although the lower redistribution layers 204 and the upper redistribution layers 206, 208, and 210 are respectively formed on the first surface 200a and the second surface 200b of the interposer substrate 200, only one redistribution layer may be formed on each of the first and second surfaces 200a and 200b. The interposer substrate 200 may include a plurality of through vias 202 penetrating through the first surface 200a and the second surface 200b. The through vias 202 may connect the lower redistribution layer 204 to the upper redistribution layers 206, 208, and 210.

The intermediate connecting members 216 may be under the lower redistribution layer 204 on the first surface 200a of the interposer substrate 200. The intermediate connecting members 216 may be connected to the substrate pads 106 of the package substrate 100. A space between the intermediate connecting members 216 on the package substrate 100 may be filled with the intermediate underfill material 218. The intermediate underfill material 218 may include or may be formed of a resin such as an epoxy resin.

The first semiconductor chip 130 may be mounted on portions of the upper redistribution layers 206, 208, and 210 on the interposer substrate 200. The first chip pad 110 of the first semiconductor chip 130 may be connected to the second upper redistribution layer 208 via the second connecting members 112. The first underfill material 113 may formed in spaces between the second connecting members 112 on the upper redistribution layers 206, 208, and 210 and the upper redistribution insulating layer 212.

The second semiconductor chip 140 may be mounted on portions of the upper redistribution layers 206, 208, and 210 on the interposer substrate 200, while being set apart from the first semiconductor chip 130 in the horizontal direction (X direction). The first gap G1 may be between the first semiconductor chip 130 and the second semiconductor chip 140. The second chip pad 116 of the second semiconductor chip 140 may be connected to the second upper redistribution layer 208 via the third connection members 118. The second underfill material 119 may fill spaces between the third connecting members 118 on the upper redistribution layers 206, 208, and 210 and the upper redistribution insulating layer 212.

In the semiconductor package 370, the first thermal interface material layer 160 may be formed in the first gap G1, between upper portions of the upper redistribution layers 206, 208, and 210 on the interposer substrate 200, the first semiconductor chip 130, and the second semiconductor chip 140. The first thermal interface material layer 160 may have the first modulus of elasticity. When the upper redistribution layers 206, 208, and 210 are not formed in the semiconductor package 370, the upper redistribution layers 206, 208, and 210 may be on the second surface 200b of the interposer substrate 200 of the first thermal interface material layer 160.

In the semiconductor package 370, the second thermal interface material layers 120 and 122 may be on the first and second semiconductor chips 130 and 140, respectively. The second thermal interface material layers 120 and 122 may be set apart from each other by the second gap G2. The second gap G2 may be the same as the first gap G1 (i.e., the width of the second gap G2 and the first gap G1 may be the same in the x-direction). The second thermal interface material layers 120 and 122 may have the second modulus of elasticity. Roles or functions of the first thermal interface material layer 160 and the second thermal interface material layers 120 and 122 have been described above in detail with reference to FIG. 3, and thus are omitted.

A manufacturing process of the semiconductor package 370 may include an operation of forming the first thermal interface material layer 160, which is adhesive, in the first gap G1 between the first and second semiconductor chips 130 and 140 mounted on the upper redistribution layers 206, 208, and 210 on the interposer substrate 200 and the upper redistribution insulating layer 212, an operation of forming the second thermal interface material layers 120 and 122, which are adhesive, on the first and second semiconductor chips 130 and 140, and an operation of curing the first thermal interface material layer 160 and the second thermal interface material layers 120 and 122.

In this manner, the semiconductor package 370 of the inventive concept may improve the package reliability by easily discharging heat generated in the first and second semiconductor chips 130 and 140, while the package components are prevented from being separated or cracked.

Figure 11:
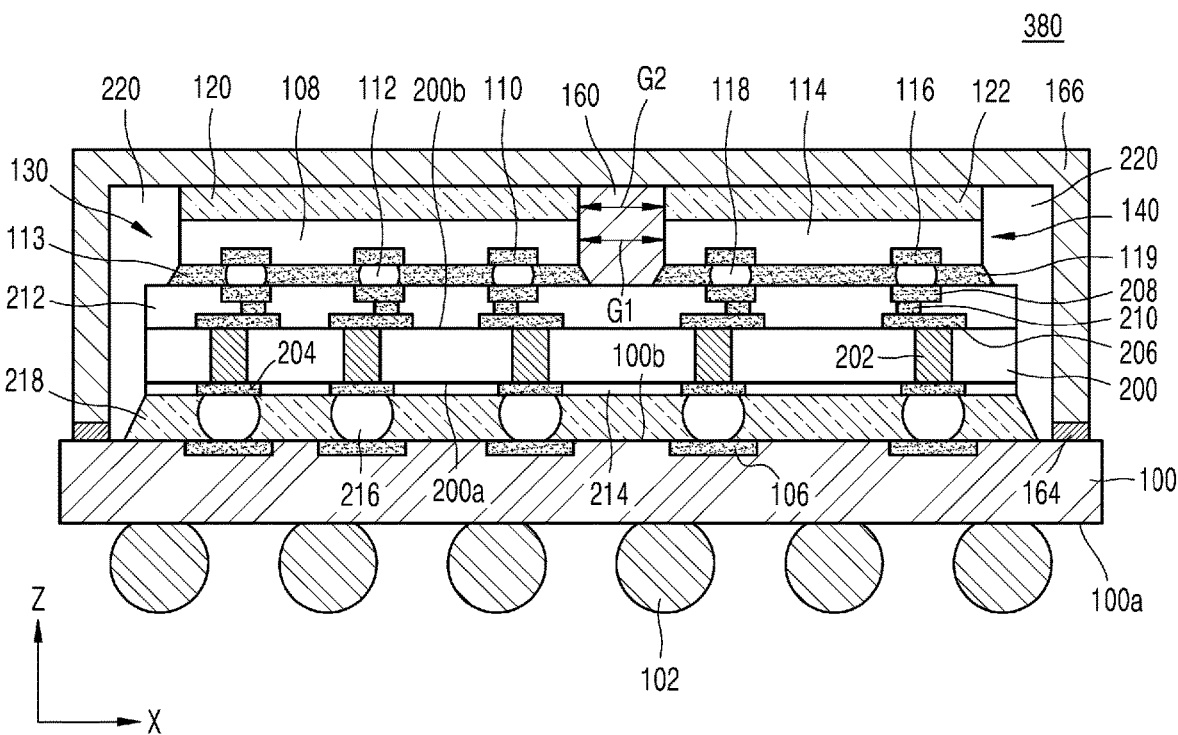
FIG. 11 is a cross-sectional view of a semiconductor package according to an embodiment of the inventive concept.

FIG. 11 is a cross-sectional view of a semiconductor package 380 according to an embodiment of the inventive concept.

The semiconductor package 380 in FIG. 11 may be the same as the semiconductor package 370 of FIG. 10 except that the heat spreader 166 is further included. With respect to the description of FIG. 11 provided below, the same descriptions provided above with reference to FIG. 10 are only briefly described or omitted for the purpose of brevity.

The semiconductor package 380 may include the package substrate 100, the interposer substrate 200, the lower redistribution layer 204, the upper redistribution layers 206, 208, and 210, the first and second semiconductor chips 130 and 140, the first thermal interface material layer 160, the second thermal interface material layers 120 and 122, and the heat spreader 166. The heat spreader 166 may be adhered to and supported on the second surface 100b, that is, the upper surface of the package substrate 100 via an adhesive layer 164.

The heat spreader 166 may surround the interposer substrate 200, the lower redistribution layer 204, the upper redistribution layers 206, 208, and 210, and the first and second semiconductor chips 130 and 140. The heat spreader 166 may be set apart from the interposer substrate 200, the lower redistribution layer 204, the upper redistribution layers 206, 208, and 210, and both edges of the first and second semiconductor chips 130 and 140. A separation space 220 may be provided between the interposer substrate 200, the lower redistribution layer 204, the upper redistribution layers 206, 208, and 210, both sides of the first and second semiconductor chips 130 and 140, and the heat spreader 166.

The heat spreader 166 may contact all or portions of the first thermal interface material layer 160 and the second thermal interface material layers 120 and 122. Because the heat spreader 166 is in contact with the first thermal interface material layer 160 and the second thermal interface material layers 120 and 122, heat may be more easily discharged from the first thermal interface material layer 160 and the second thermal interface material layers 120 and 122.

A manufacturing process of the semiconductor package 380 may include an operation of forming the first thermal interface material layer 160, which is adhesive, in the first gap G1 between the first and second semiconductor chips 130 and 140 mounted on the upper redistribution layers 206, 208, and 210 and the upper redistribution insulating layer 212 on the interposer substrate 200, an operation of forming the second thermal interface material layers 120 and 122, which are adhesive, on the first and second semiconductor chips 130 and 140, and an operation of compressing the heat spreader 166 including the adhesive layer 164, which is adhesive, on the package substrate 100 and curing the first thermal interface material layer 160 and the second thermal interface material layers 120 and 122.

The semiconductor package 380 described above may greatly improve the package reliability by easily discharging heat generated from the package components, while preventing separation phenomenon or crack occurrence phenomenon of the package components described above.

Figure 12:
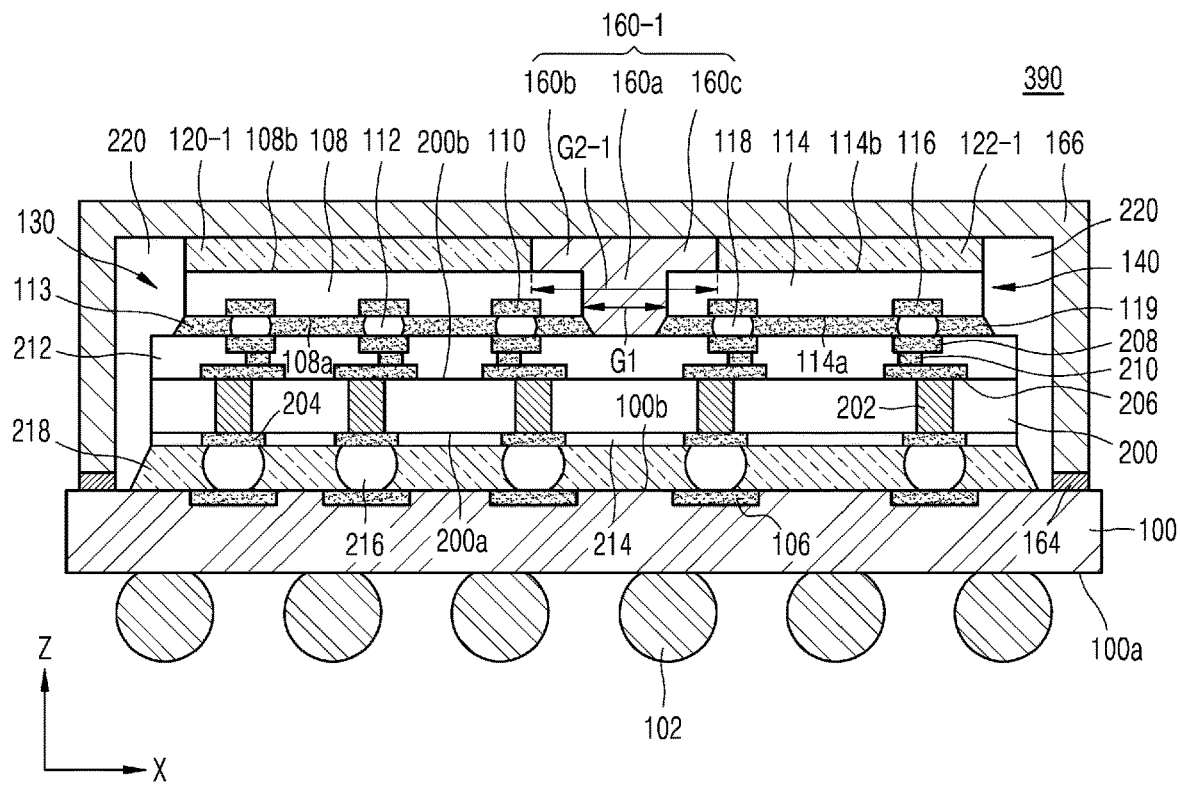
FIG. 12 is a cross-sectional view of a semiconductor package according to an embodiment of the inventive concept.

FIG. 12 is a cross-sectional view of a semiconductor package 390 according to an embodiment of the inventive concept.

The semiconductor package 390 may be the same as the semiconductor package 380 of FIG. 11 except that the first thermal interface material layer 160-1 extends onto a portion of upper surfaces of the first and second semiconductor chips 130 and 140. With respect to the description of FIG. 12 provided below, the same descriptions provided above with reference to FIG. 11 are only briefly described or omitted for the purpose of brevity.

The semiconductor package 390 may include the package substrate 100, the interposer substrate 200, the lower redistribution layer 204, the upper redistribution layers 206, 208, and 210, the first and second semiconductor chips 130 and 140, the first thermal interface material layer 160-1, the second thermal interface material layers 120-1 and 122-1, and the heat spreader 166.

The first thermal interface material layer 160-1 may be formed inside the first gap G1 on the upper redistribution layers 206, 208, and 210 and the upper redistribution insulating layer 212 on the interposer substrate 200, and may be extended from the first gap G1 onto the second surfaces 108b and 114b of the first and second semiconductor chips 130 and 140, that is, onto portions of the upper surfaces.

The first thermal interface material layer 160-1 may include a first portion 160a formed in the first gap G1, a second portion 160b formed on a portion of the second surface 108b of the first semiconductor chip 130, and a third portion 160c formed on a portion of the second surface 114b of the second semiconductor chip 140. Accordingly, the second thermal interface material layers 120 and 122 may be set apart from each other by the second gap G2-1. The second gap G2-1 may be greater than the first gap G1.

A manufacturing process of the semiconductor package 390 may be the same as that of FIG. 11 except that a sufficient amount (i.e., an amount in excess of the volume capacity of the first gap G1) of the first thermal interface material layer 160-1, which is adhesive, is formed in the first gap G1 between the first and second semiconductor chips 130 and 140 on the upper redistribution layers 206, 208, and 210 and the upper redistribution insulating layer 212 on the interposer substrate 200. When the sufficient amount of the first thermal interface material layer 160-1, which is adhesive, is formed in the first gap G1 between the first and second semiconductor chips 130 and 140, the first thermal interface material layer 160-1 may be extended to a portion of the upper surfaces of the first and second semiconductor chips 130 and 140.

When the first thermal interface material layer 160-1 extends onto portions of the upper surfaces of the first and second semiconductor chips 130 and 140, the semiconductor package 390 may greatly improve the package reliability by further preventing separation phenomenon or crack occurrence phenomenon of the package components described above.

Figure 13:
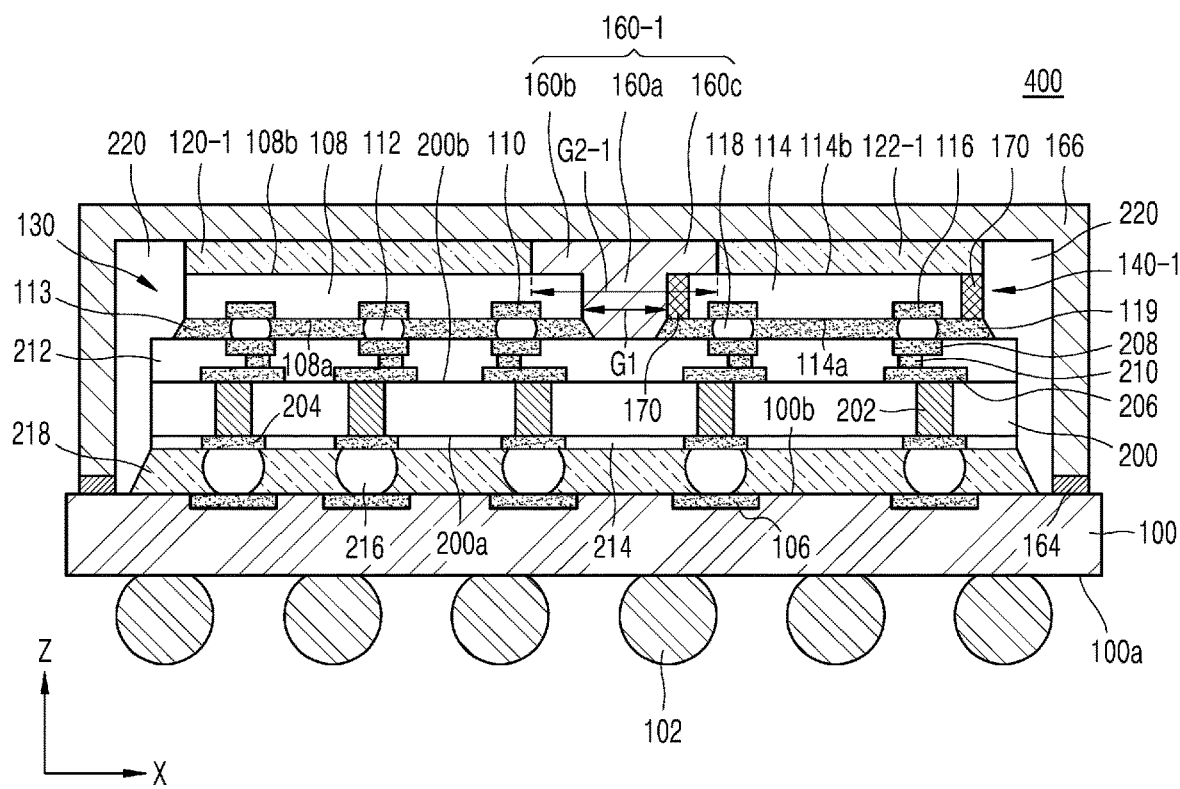
FIG. 13 is a cross-sectional view of a semiconductor package according to an embodiment of the inventive concept.

FIG. 13 is a cross-sectional view of a semiconductor package 400 according to an embodiment of the inventive concept.

The semiconductor package 400 may be the same as the semiconductor package 390 of FIG. 12 except that the molding layer 170 is included in the second semiconductor chip 140-1. With respect to the description of FIG. 13 provided below, the same descriptions provided above with reference to FIG. 12 are only briefly described or omitted for the purpose of brevity.

The semiconductor package 400 may include the package substrate 100, the interposer substrate 200, the lower redistribution layer 204, the upper redistribution layers 206, 208, and 210, the first semiconductor chip 130, the second semiconductor chip 140-1, the first thermal interface material layer 160-1, the second thermal interface material layers 120-1 and 122-1, and the heat spreader 166.

The molding layer 170 may be formed on both side surfaces of the second semiconductor chip 140-1. The molding layer 170 may include or may be formed of an epoxy resin. Because the second semiconductor chip 140-1 includes the molding layer 170, the second semiconductor chip 140-1 may be referred to as a sub-semiconductor package. The molding layer 170 may contact the first thermal interface material layer 160-1.

Although the semiconductor package 400 includes the second semiconductor chip 140-1, in which the molding layer 170 is formed, that is, the sub-semiconductor package, the semiconductor package 400 may greatly improve the package reliability by preventing separation phenomenon or crack occurrence phenomenon of the package components described above, as well as easily discharging heat generated from the package components.

Figure 14:
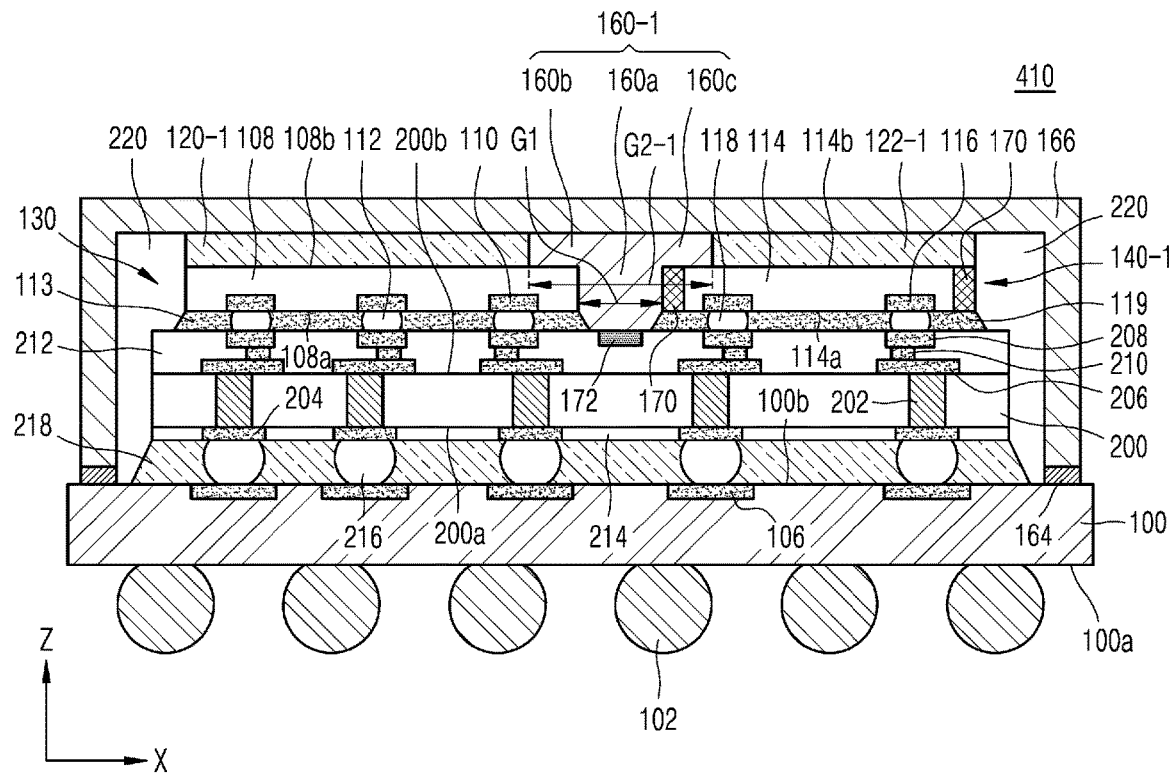
FIG. 14 is a cross-sectional view of a semiconductor package according to an embodiment of the inventive concept.

FIG. 14 is a cross-sectional view of a semiconductor package 410 according to an embodiment of the inventive concept.

The semiconductor package 410 may be the same as the semiconductor packages 400 of FIG. 13 except that the heat transfer wiring pattern 172 is included in the upper redistribution insulating layer 212. With respect to the description of FIG. 14 provided below, the same descriptions provided above with reference to FIG. 13 are only briefly or omitted for the purpose of brevity.

The semiconductor package 410 may include the package substrate 100, the interposer substrate 200, the lower redistribution layer 204, the upper redistribution layers 206, 208, and 210, the heat transfer wiring pattern 172, the first semiconductor chip 130, the second semiconductor chip 140-1, the first thermal interface material layer 160-1, the second thermal interface material layers 120-1 and 122-1, and the heat spreader 166.

The heat transfer wiring pattern 172 may be on the upper redistribution insulating layer 212. The heat transfer wiring pattern 172 may be under the first gap G1. The heat transfer wiring pattern 172 may contact the first thermal interface material layer 160-1. The heat transfer wiring pattern 172 may contact the first portion 160a of the first thermal interface material layer 160-1. The heat transfer wiring pattern 172 may include or may be formed of a metal pattern.

By including the heat transfer wiring pattern 172 in contact with the first thermal interface material layer 160-1 on the upper redistribution insulating layer 212, the semiconductor package 410 may greatly improve the package reliability by preventing separation phenomenon or crack occurrence phenomenon of the package components described above, as well as easily discharging heat generated from the package components.

Figure 15:
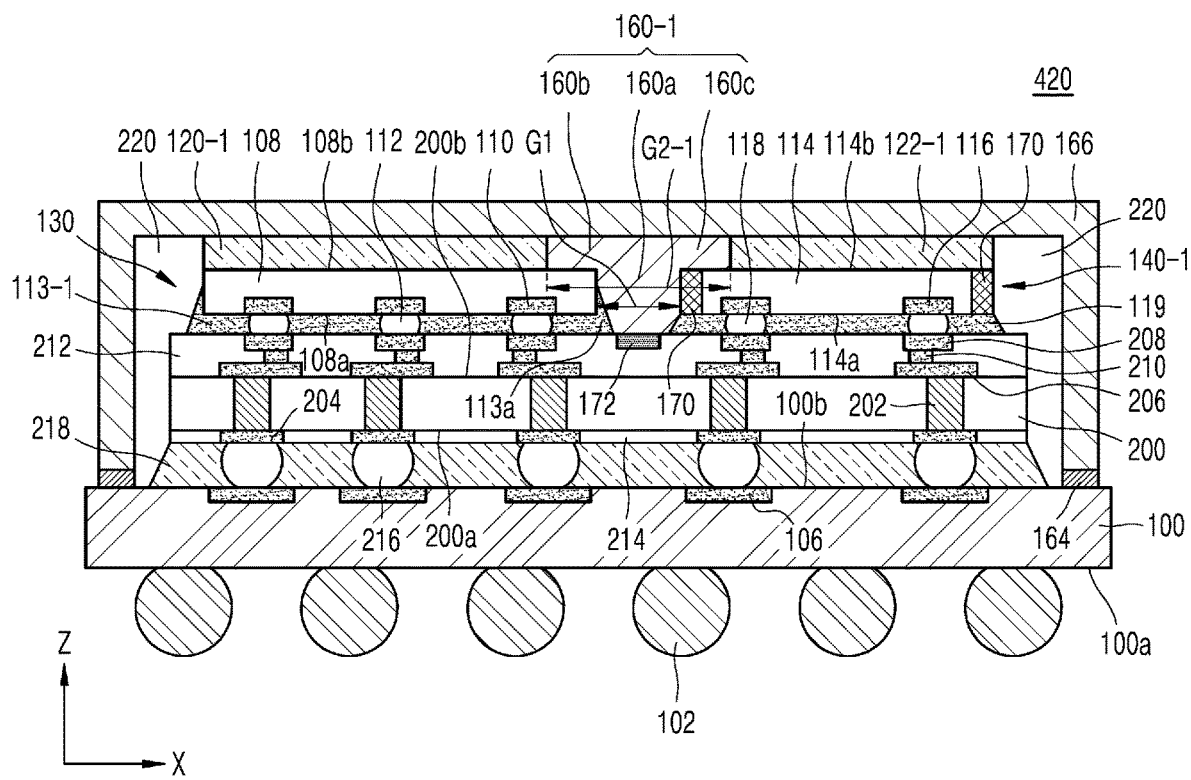
FIG. 15 is a cross-sectional view of a semiconductor package according to an embodiment of the inventive concept.

FIG. 15 is a cross-sectional view of a semiconductor package 420 according to an embodiment of the inventive concept.

The semiconductor package 420 may be the same as the semiconductor package 410 in FIG. 14 except that the first underfill material 113-1 is also formed on the sidewalls of the first chip body 108. With respect to the description of FIG. 15 provided below, the same descriptions provided above with reference to FIG. 14 are only briefly described or omitted for the purpose of brevity.

The semiconductor package 420 may include the package substrate 100, the interposer substrate 200, the lower redistribution layer 204, the upper redistribution layers 206, 208, and 210, the heat transfer wiring pattern 172, the first semiconductor chip 130, the second semiconductor chip 140-1, the first thermal interface material layer 160-1, the second thermal interface material layers 120-1 and 122-1, and the heat spreader 166.

The first underfill material 113-1 may fill spaces between the upper redistribution layers 206, 208, and 210 and the second connecting members 112 on the upper redistribution insulating layer 212. The first underfill material 113-1 may include a portion 113a extended beyond the first surface 108a of the first chip body 108 and extended partially along a sidewall of the first chip body 108 facing away from the first gap G1. Portion 113a may also extend beyond the first surface 108a of the first chip body 108 and extend partially along a sidewall of the first chip body 108 facing towards the first gap G1. The first thermal interface material layer 160-1 may be formed in the first gap G1 on the portion 113a extended partially along a sidewall of the first chip body 108 facing towards the first gap G1. In other words, the portion 113a formed partially on the sidewall of the first semiconductor chip 130 facing towards the first gap G1 may contact the first thermal interface material layer 160-1 in the first gap G1.

In the semiconductor package 420, the first underfill material 113-1 may be extended to the sidewall of the first chip body 108, and thus, the first semiconductor chip 130 may be stably mounted on the package substrate 100. In addition, the semiconductor package 420 may greatly improve the package reliability by preventing separation phenomenon or crack occurrence phenomenon of the package components described above, as well as easily discharging heat generated from the package components.

Figure 16:
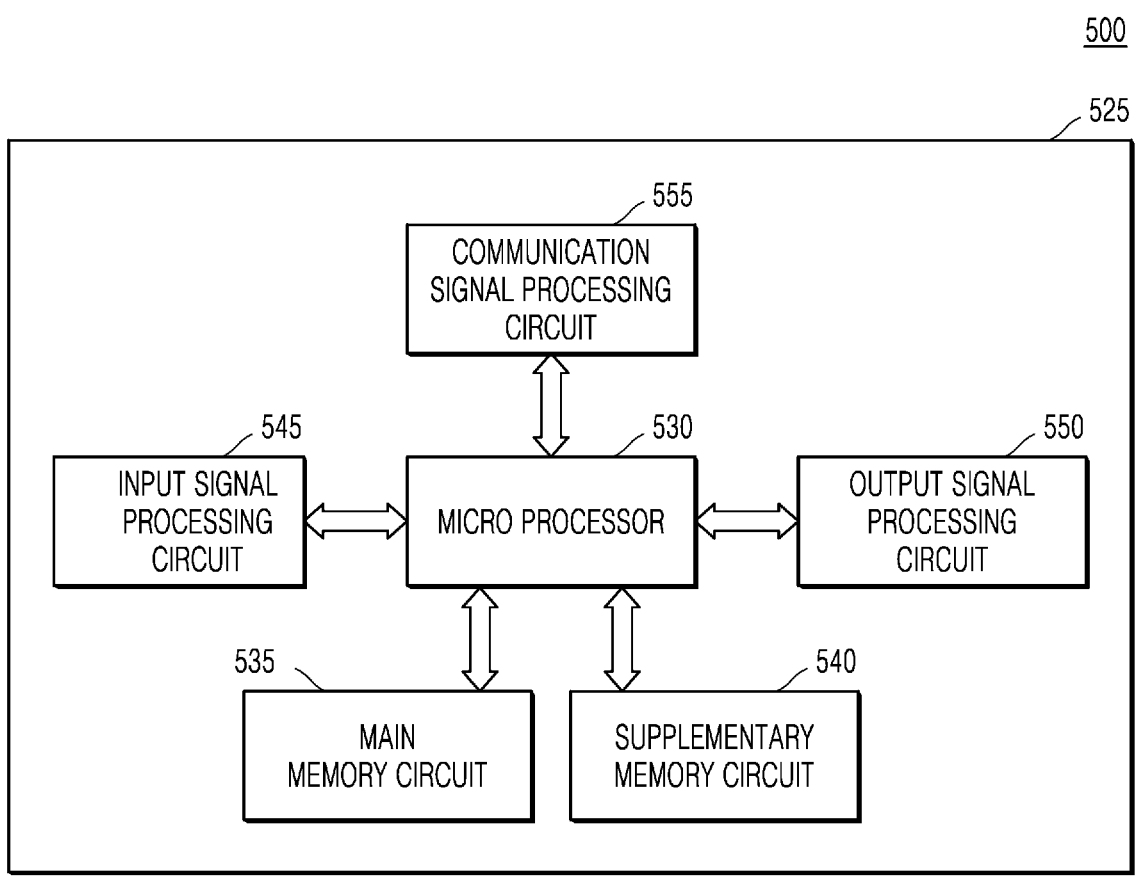
FIG. 16 is a schematic block diagram of an electronic circuit substrate including a semiconductor package, according to an embodiment of the inventive concept.

FIG. 16 is a schematic block diagram of an electronic circuit substrate 500 including a semiconductor package, according to an embodiment of the inventive concept.

The electronic circuit board 500 may include a microprocessor 530 on a circuit board 525, a main storage circuit 535 and a supplementary storage circuit 540 communicating with the microprocessor 530.

The electronic circuit board 500 may include an input signal processing circuit 545 sending commands to the microprocessor 530, an output signal processing circuit receiving commands from the microprocessor 530, and a communication signal processing circuit 555 exchanging electrical signals with other circuit substrates. Arrows may be understood to mean paths through which electrical signals are transmitted.

The microprocessor 530 may receive and process various electric signals and output a processing result, and may control other components of the electronic circuit board 500. The microprocessor 530 may be understood as, for example, a central processing unit (CPU), and/or a main control unit (MCU).

The main memory circuit 535 may temporarily store data that the microprocessor 530 always or frequently needs or data before and after processing. Because the main memory circuit 535 requires a fast response, the main memory circuit 535 may include a memory chip. In addition, the main memory circuit 535 may include random access memory (RAM).

In the present embodiment, the semiconductor package according to the technical idea of the inventive concept may include the microprocessor 530 and the main memory circuit 535. The supplementary memory circuit 540 may include a large-capacity memory device, and may include a non-volatile semiconductor memory such as a flash memory or a hard disk drive using a magnetic field. Alternatively, the supplementary memory circuit 540 may include a compact disk drive using light. Compared with the main memory circuit 535, the supplementary memory circuit 540 may be used when a fast speed is not required, but a large amount of data is to be stored. The supplementary memory circuit 540 may include a non-volatile memory device.

The input signal processing circuit 545 may convert an external command into an electrical signal, or may transmit the electrical signal transmitted from the outside to the microprocessor 530. The input signal processing circuit 545 may include, for example, a terminal signal processing circuit that processes signals transmitted from a keyboard, a mouse, a touch pad, an image recognition device, or various sensors, an image signal processing circuit that processes an image signal input from a scanner or a camera, various sensors, various input signal interfaces, etc.

The output signal processing circuit 550 may include a component for transmitting the electrical signal processed by the microprocessor 530 to the outside. For example, the output signal processing circuit 550 may include a graphics card, an image processor, an optical converter, a beam panel card, an interface circuit having various functions, etc.

The communication circuit 555 may include a component for directly transmitting and/or receiving an electrical signal with another electronic system or another circuit board without passing through the input signal processing circuit 545 or the output signal processing circuit 550. For example, the communication signal processing circuit 555 may include a modem of a personal computer system, a LAN card, or various interface circuits.

Figure 17:
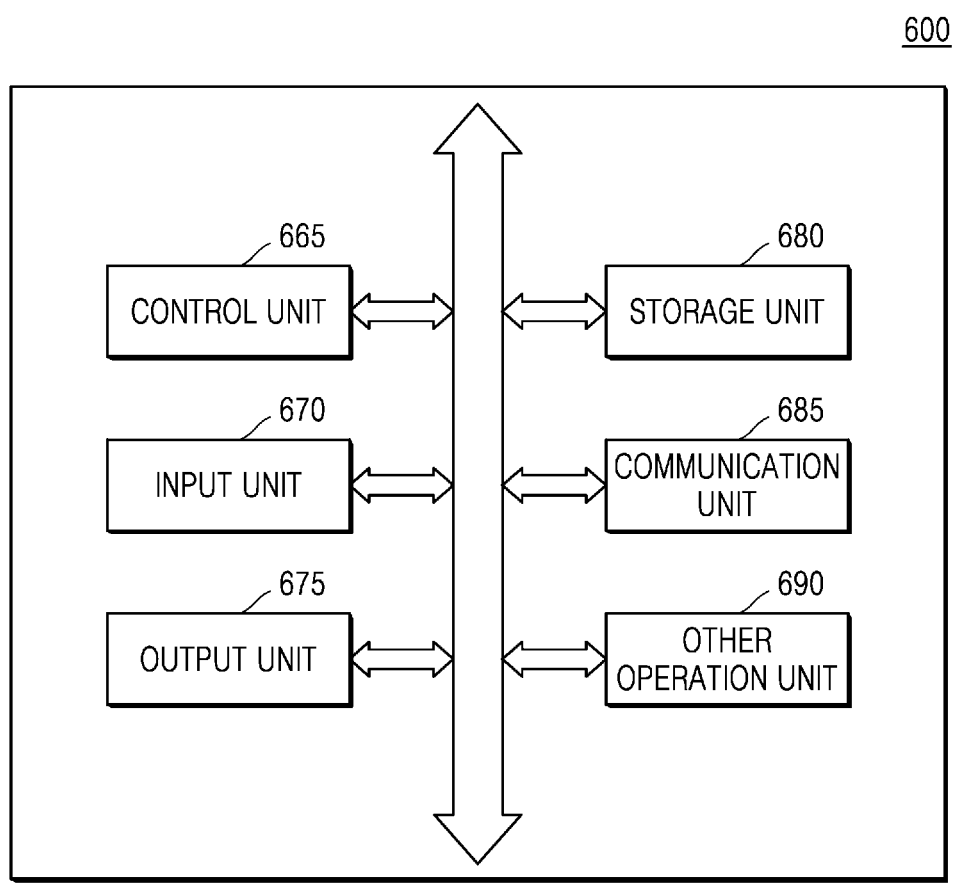
FIG. 17 is a schematic block diagram of an electronic system including a semiconductor package, according to an embodiment of the inventive concept.

FIG. 17 is a schematic block diagram of an electronic system 600 including a semiconductor package, according to an embodiment of the inventive concept.

The electronic system 600 may include a control unit 665, an input unit 670, an output unit 675, and a storage unit 680, and may further include a communication unit 685, and/or another operation unit 690.

The control unit 665 may collectively control the electronic system 600 and components. The control unit 665 may be understood as a CPU or a central control unit, and may include an electronic circuit board (500 of FIG. 16) according to an embodiment of the inventive concept. In addition, the control unit 665 may include a semiconductor package according to the technical idea of the inventive concept.

The input unit 670 may send an electrical command signal to the control unit 665. The input unit 670 may include an image recognizer such as a keyboard, a keypad, a mouse, a touch pad, and a scanner, or various input sensors. The output unit 675 may receive an electric command signal from the control unit 665 and output a processing result of the electronic system 600. The output unit 675 may include a monitor, a printer, a beam irradiator, or various mechanical devices.

The storage unit 680 may include a component for temporarily or permanently storing an electrical signal to be processed by the control unit 665 or the processed electrical signal. The storage unit 680 may be physically or electrically connected to or coupled with the control unit 665. The storage unit 680 may include a semiconductor memory, a magnetic storage device such as a hard disk, an optical storage device such as a compact disk, or a server having other data storage functions.

The communication unit 685 may receive an electric command signal from the control unit 665 and transmit an electric signal to another electronic system. The communication unit 685 may include a modem, a wired transmission/reception device such as a LAN card, a wireless transmission/reception device such as a WiBro interface, or an infrared port, etc. The communication unit 685 may include a semiconductor package according to the technical idea of the inventive concept.

The other operation unit 690 may perform a physical or mechanical operation according to a command of the control unit 665. For example, the other operation unit 690 may include a component that performs a mechanical operation, such as a plotter, an indicator, and an up/down operator. The electronic system 600 according to the technical idea of the inventive concept may include a computer, a network server, a networking printer or scanner, a wireless controller, a mobile communication terminal, a switchboard, or other electronic device that performs a programmed operation.

In addition, the electronic system 600 may be used in a mobile phone, an MP3 player, a navigation, a portable multimedia player (PMP), solid state disk (SSD), or household appliances.

Figure 18:
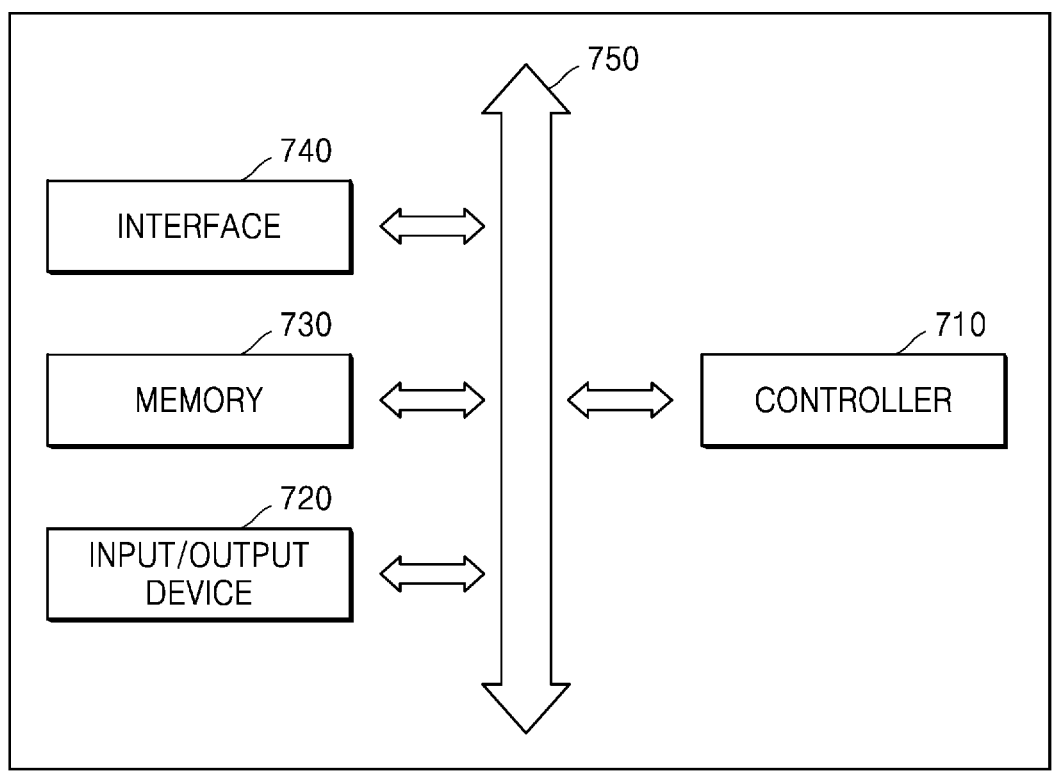
FIG. 18 is a schematic diagram of an electronic system including a semiconductor package, according to an embodiment of the inventive concept.

FIG. 18 is a schematic diagram of an electronic system 700 including a semiconductor package, according to an embodiment of the inventive concept.

The electronic system 700 may include a controller 710, an input/output device 720, a memory 730, and an interface 740. The electronic system 700 may include a mobile system or a system which transmits and/or receives information. The mobile system may include a personal digital assistant (PDA), a portable computer, a web tablet, a wireless phone, a mobile phone, a digital music player, or a memory card.

The controller 710 may execute a program and control the electronic system 700. The controller 710 may include a semiconductor package according to an embodiment of the inventive concept. The controller 710 may include, for example, a microprocessor, a digital signal processor, a microcontroller, or a similar device.

The input/output device 720 may be used to input or output data of the system 700. The system 700 may be connected to an external device, for example, a personal computer or a network by using the input/output device 720, and may exchange data with the external device. The input/output device 720 may include, for example, a keypad, a keyboard, or a display.

The memory 730 may store code and/or data for the operation of the controller 710, and/or may store data processed by the controller 710. The interface 740 may be a data transmission path between the electronic system 700 and the external device. The controller 710, the input/output device 720, the memory 730, and the interface 740 may communicate with each other via the bus 750.

For example, the electronic system 700 may be used in a mobile phone, an MP3 player, a navigation, a portable multimedia player (PMP), solid state disk (SSD), or household appliances.

While the inventive concept has been particularly shown and described with reference to embodiments thereof, it will be understood that various changes in form and details may be made therein without departing from the spirit and scope of the following claims.

What is claimed is:

1. A semiconductor package comprising:
 a package substrate extending in a first direction and a second direction perpendicular to the first direction;
 a first semiconductor chip mounted on the package substrate;
 a second semiconductor chip mounted on the package substrate and set apart from the first semiconductor chip in the first direction thereby forming a gap between the first semiconductor chip and the second semiconductor chip;
 a first thermal interface material layer formed in the gap and in contact with the package substrate, the first thermal interface material layer having a first modulus of elasticity; and
 a second thermal interface material layer formed on each of the first semiconductor chip and the second semiconductor chip and having a second modulus of elasticity,
 wherein the first modulus of elasticity is less than the second modulus of elasticity.

2. The semiconductor package of claim 1, wherein a surface of the first thermal interface material layer, a surface of the first semiconductor chip, and a surface of the second semiconductor chip are coplanar.

3. The semiconductor package of claim 1, wherein a surface of the first thermal interface material layer, a surface of the second thermal interface material layer formed on the first semiconductor chip, a surface of the second thermal interface material layer formed on the second semiconductor chip are coplanar.

4. The semiconductor package of claim 1, further comprising:
a heat spreader supported on the package substrate and contacting all of the first thermal interface material layer and the second thermal interface material layer formed on each of the first semiconductor chip and the second semiconductor chip while surrounding the first semiconductor chip and the second semiconductor chip.

5. The semiconductor package of claim 1, wherein a first portion of the first thermal interface material layer is formed in the gap, a second portion of the first thermal interface material extends onto a surface of the first semiconductor chip, and a third portion of the first thermal interface material extends onto a surface of the second semiconductor chip.

6. The semiconductor package of claim 1, wherein at least one of the first semiconductor chip and the second semiconductor chip comprises a molding layer formed on side surfaces thereof.

7. The semiconductor package of claim 1, wherein a heat transfer wiring pattern in contact with the first thermal interface material layer is formed on the package substrate.

8. The semiconductor package of claim 1, wherein the first thermal interface material layer and the second thermal interface material layer formed on each of the first semiconductor chip and the second semiconductor chip comprise a base material including a filler, and the first modulus of elasticity and the second modulus of elasticity vary depending on a type of the filler or an amount of the filler.

9. The semiconductor package of claim 1, wherein the first thermal interface material layer has greater heat conductivity than the second thermal interface material layer formed on each of the first semiconductor chip and the second semiconductor chip.

10. A semiconductor package comprising:
a package substrate extending in a first direction and a second direction perpendicular to the first direction;
an interposer substrate mounted on the package substrate;
a first semiconductor chip mounted on the interposer substrate;
a second semiconductor chip mounted on the interposer substrate and set apart from the first semiconductor chip in the first direction thereby forming a gap between the first semiconductor chip and the second semiconductor chip;
a first thermal interface material layer formed in the gap and in contact with the interposer substrate, the first thermal interface material layer having a first modulus of elasticity; and
a second thermal interface material layer formed on each of the first semiconductor chip and the second semiconductor chip and having a second modulus of elasticity,
wherein the first modulus of elasticity is less than the second modulus of elasticity.

11. The semiconductor package of claim 10, wherein the interposer substrate comprises a plurality of through vias connected to the package substrate, and an upper redistribution layer connected to the plurality of through vias, the first semiconductor chip, and the second semiconductor chip.

12. The semiconductor package of claim 10, wherein a lower redistribution layer is formed under the interposer substrate, the lower redistribution layer is connected to the package substrate via a plurality of intermediate connecting members, and an intermediate underfill material is formed between the intermediate connecting members.

13. The semiconductor package of claim 10, wherein a surface of the first thermal interface material layer, a surface of the second thermal interface material layer formed on the first semiconductor chip, and a surface of the second thermal interface material layer formed on the second semiconductor chip are coplanar.

14. The semiconductor package of claim 10, further comprising:
a heat spreader supported on the package substrate and contacting all of the first thermal interface material layer and the second thermal interface material layer formed on each of the first semiconductor chip and the second semiconductor chip while surrounding the interposer substrate, the first semiconductor chip, and the second semiconductor chip.

15. The semiconductor package of claim 10, wherein a first portion of the first thermal interface material layer is formed in the gap, a second portion of the first thermal interface material extends onto a surface of the first semiconductor chip, and a third portion of the first thermal interface material extends onto a surface of the second semiconductor chip.

16. A semiconductor package comprising:
a package substrate extending in a first direction and a second direction perpendicular to the first direction, the package substrate comprising a first surface and a second surface opposite to the first surface;
a plurality of first connecting members on the first surface of the package substrate;
an interposer substrate on the second surface of the package substrate, and connected to the package substrate via a plurality of intermediate connecting members on the second surface; a first semiconductor chip on the interposer substrate;
a second semiconductor chip on the interposer substrate and set apart from the first semiconductor chip in the first direction thereby forming a gap between the first semiconductor chip and the second semiconductor chip, wherein the first semiconductor chip and the second semiconductor chip are each connected to a plurality of second connecting members and a plurality of third connecting members on the interposer substrate;
a first thermal interface material layer formed in the gap and in contact with the interposer substrate;
a second thermal interface material layer formed on each of the first semiconductor chip and the second semiconductor chip, the material composition of the second thermal interface material layer being different than the material composition of the first thermal interface material layer; and
a heat spreader supported on the package substrate and contacting all of the first thermal interface material layer and the second thermal interface material layer formed on each of the first semiconductor chip and the second semiconductor chip while surrounding the interposer substrate, the first semiconductor chip, and the second semiconductor chip.

17. The semiconductor package of claim 16, wherein spaces between the second connecting members and the third connecting members contain a first underfill material and a second underfill material on the interposer substrate, respectively.

18. The semiconductor package of claim 16, wherein a molding layer is formed on both sides of at least one of the first semiconductor chip and the second semiconductor chip, and the molding layer is in contact with the first thermal interface material layer.

19. The semiconductor package of claim 16, wherein a heat transfer wiring pattern in contact with the first thermal interface material layer is formed on the interposer substrate.

20. The semiconductor package of claim 16, wherein an underfill material formed between the interposer substrate and the first semiconductor chip and the second semiconductor chip extends partially into the gap and is in contact with the first thermal interface material layer.

* * * * *